United States Patent
Kuo et al.

(10) Patent No.: US 12,057,353 B2
(45) Date of Patent: Aug. 6, 2024

(54) MEASUREMENT PATTERN AND METHOD FOR MEASURING OVERLAY SHIFT OF BONDED WAFERS

(71) Applicant: Taiwan Semiconductor Manufacturing Company, Ltd., Hsinchu (TW)

(72) Inventors: Ming-Sung Kuo, Hsinchu (TW); Hsun-Kuo Hsiao, Hsinchu (TW); Chung-Cheng Chen, Miaoli County (TW); Po-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 549 days.

(21) Appl. No.: 17/395,426

(22) Filed: Aug. 5, 2021

(65) Prior Publication Data
US 2023/0045223 A1 Feb. 9, 2023

(51) Int. Cl.
*H01L 21/66* (2006.01)

(52) U.S. Cl.
CPC .............. *H01L 22/12* (2013.01); *H01L 22/26* (2013.01)

(58) Field of Classification Search
CPC ......... H01L 22/12; H01L 22/26; H01L 22/30; H01L 21/681; H01L 21/8221
USPC .......................................................... 156/64
See application file for complete search history.

(56) References Cited

U.S. PATENT DOCUMENTS

2019/0355698 A1* 11/2019 Guo ...................... H01L 23/544
2021/0183814 A1* 6/2021 Wang .................. H01L 25/0657

* cited by examiner

*Primary Examiner* — James D Sells
(74) *Attorney, Agent, or Firm* — JCIPRNET

(57) ABSTRACT

A measurement pattern for monitoring overlay shift of bonded wafers includes a top wafer pattern and a bottom wafer pattern. The top wafer pattern includes a first portion with a width $Wx1$ measured along a first axis. The bottom wafer pattern includes a first part with a width $Wx2$ measured along the first axis, wherein the first portion of the top wafer pattern and the first part of the bottom wafer pattern are separated by a target distance $Dx$, and wherein the measurement pattern satisfies the following measurement formulas:

$$Tx > Dx - Sx;$$
$$Tx < Dx - Sx + Wx2;$$
$$Tx > Sx;$$
$$Tx < Dx - Sx + Wx1;$$

wherein, $Tx$ represents a searching distance for finding an end-point of the first portion or an end-point of the first part; and $Sx$ represents an actual shifting amount of the first portion.

20 Claims, 19 Drawing Sheets

MEASUREMENT PATTERN AND METHOD FOR MEASURING OVERLAY SHIFT OF BONDED WAFERS

BACKGROUND

Improvements for wafer to wafer bonding are increasingly important in 3DIC (three-dimensional integrated circuit) structures. For example, wafer bonding has been used to provide increased integration by forming vertical stacks of semiconductor devices without the need for intervening structures such as substrates or circuit boards. Current semiconductor process for monitoring wafer bonding shift is usually based on the visual inspection from the naked-eye to judge the bonding accuracy. However, the measurement accuracy is rough, and the productivity may be slow. More effective and less time-consuming methods are proposed to improve overlay shifting control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
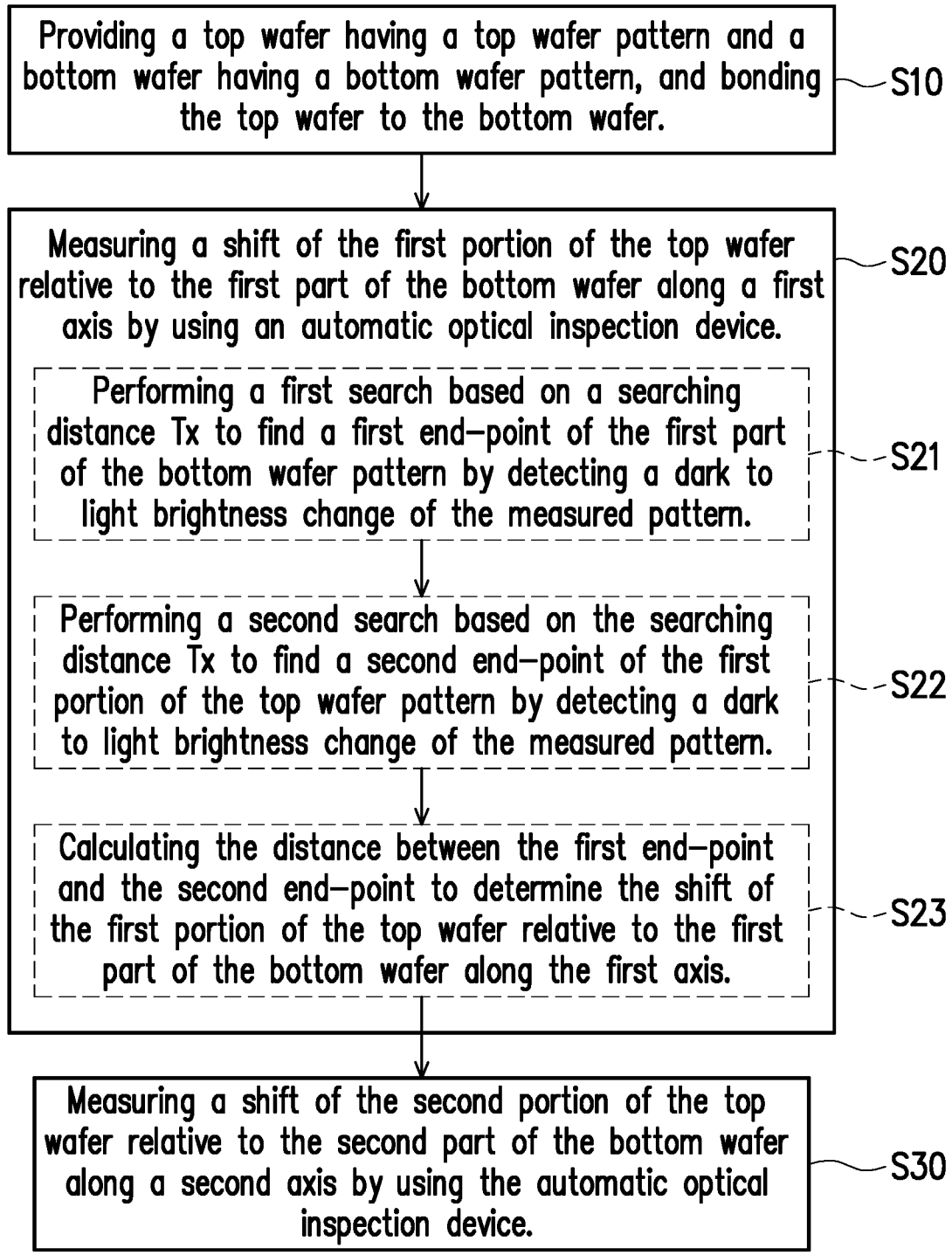
FIG. 1 is a flow chart of a method for measuring overlay shift of bonded wafers according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method for measuring overlay shift of bonded wafers according to some exemplary embodiments of the present disclosure. FIG. 2A to FIG. 6D are schematic sectional and top-views of various stages of a method for measuring overlay shift of bonded wafers according to some exemplary embodiments of the present disclosure. The method illustrated in FIG. 2A to FIG. 6D will be explained with reference to FIG. 1.

Figure 2A:
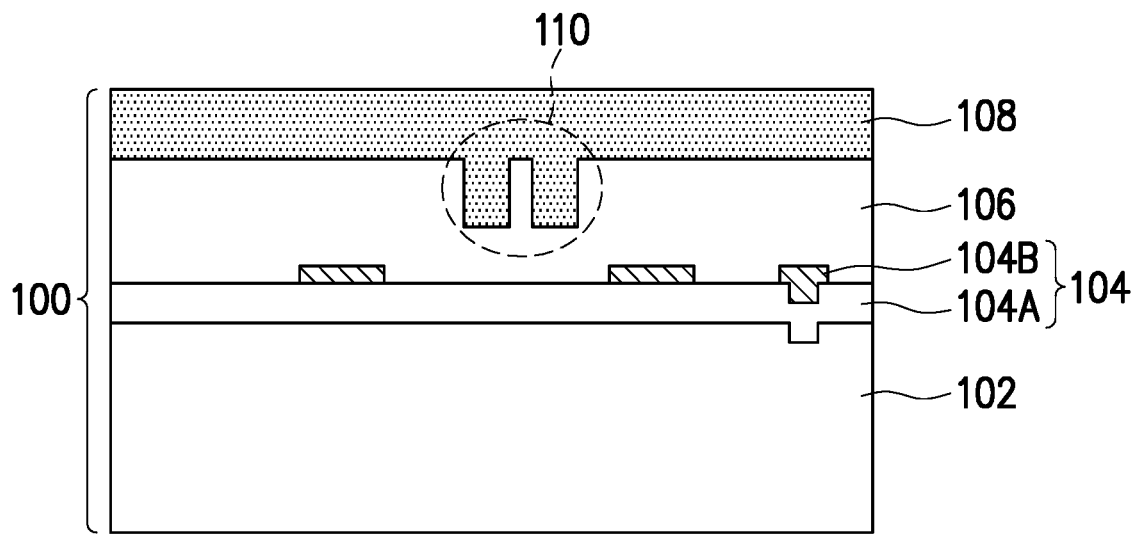
FIG. 2A to FIG. 6D are schematic sectional and top-views of various stages of a method for measuring overlay shift of bonded wafers according to some exemplary embodiments of the present disclosure.
Figure 2A:
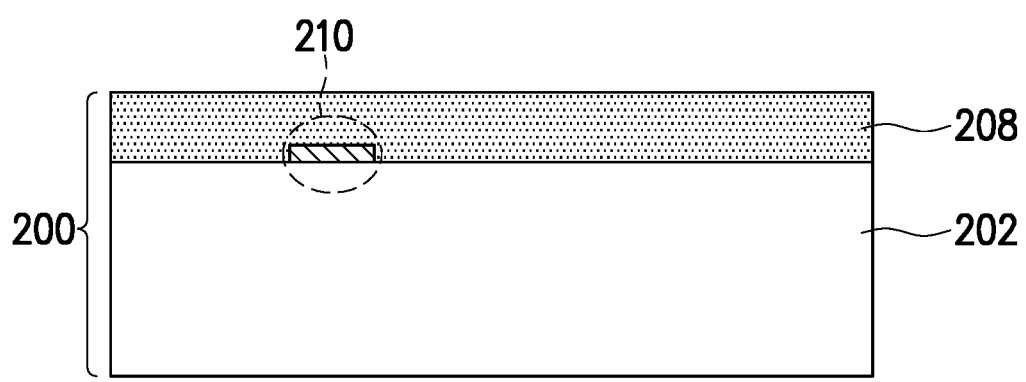

Referring to step S10 in FIG. 1 and as illustrated in FIG. 2A, a top wafer 100 and a bottom wafer 200 is provided. In some embodiments, the top wafer 100 includes a substrate 102, an interconnection layer 104, an insulating layer 106 and a dielectric material layer 108. The substrate 102 may be a glass substrate or any other suitable transparent substrate for carrying the components located thereon. The interconnection layer 104 is disposed on the substrate 102 and may include a dielectric layer 104A and a conductive layer 104B. For example, the dielectric layer 104A is disposed on the substrate 102, while the conductive layer 104B is disposed on the dielectric layer 104A. Although only one layer of dielectric layer 104A and one layer of conductive layer 104B are illustrated herein, it should be noted that the number of the dielectric layer 104A and the conductive layer 104B are not limited thereto. In some other embodiments, there are multiple dielectric layers 104A and multiple conductive layers 104B in the interconnection layer 104 for providing electrical connection between components. In some embodiments, the interconnection layer 104 may be electrically connected to various active components (e.g., transistors or the like) or passive components (e.g., resistors, capacitors, inductors or the like) in the top wafer 100 through the conductive layer 104B, or may be used for providing electrical connection to various semiconductor dies or chips (not illustrated).

In some embodiments, the insulating layer 106 is disposed on the interconnection layer 104 and covering the interconnection layer 104. The insulating layer 106 may include insulating materials such as silicon nitride (SiN), or the like. Furthermore, the dielectric material layer 108 is disposed on the insulating layer 106, and may include polymer-based materials such as benzocyclobutene (BCB), or include other dielectric materials, or the like. As illustrated in FIG. 2A, the dielectric material layer 108 includes a top wafer pattern 110. For example, the top wafer pattern 110 includes a plurality of stripe patterns that protrudes into the insulating layer 106. In other words, the top wafer pattern 110 may be formed by patterning the insulating layer 106 to form a plurality of openings (stripe openings or trenches), and forming the dielectric material layer 108 into the openings to define the top wafer pattern 110.

As further illustrated in FIG. 2A, in some embodiments, the bottom wafer 200 includes a substrate 202, a dielectric material layer 208 and a bottom wafer pattern 210. The substrate 202 may be a glass substrate or any other suitable transparent substrate for carrying the components located thereon. The dielectric material layer 208 is disposed on the substrate 202, and may include polymer-based materials such as benzocyclobutene (BCB), or include other dielectric materials, or the like. The bottom wafer pattern 210 is disposed on the substrate 202 and covered by the dielectric material layer 208. In some embodiments, the bottom wafer pattern 210 comprises a bulk pattern, and the bulk pattern is made of metallic material. Similar to the top wafer 100, the bottom wafer 200 may also include an interconnection layer (not shown) that is electrically connected to various active components (e.g., transistors or the like) or passive components (e.g., resistors, capacitors, inductors or the like) in the bottom wafer 200, or may be used for providing electrical connection to various semiconductor dies or chips (not illustrated).

Figure 2B:
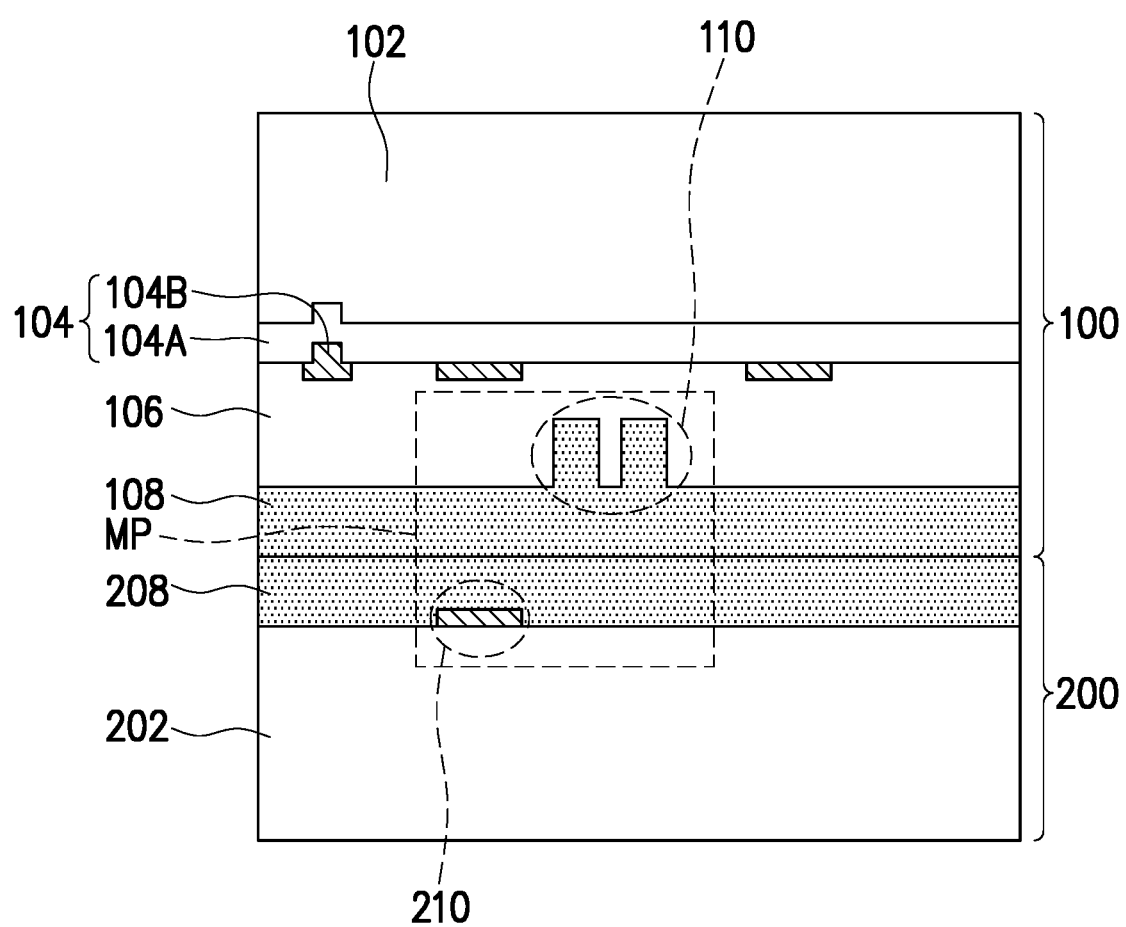

Referring to step S10 in FIG. 1 and as illustrated in FIG. 2B, the top wafer 100 is bonded to the bottom wafer 200. For example, the dielectric material layer 108 of the top wafer 100 is bonded to the dielectric material layer 208 of the bottom wafer through direct bonding or fusion bonding. In some embodiments, in the bonded wafers, the top wafer pattern 110 of the top wafer 100 may be aligned to the bottom wafer pattern 210 of the bottom wafer 200 to constitute a measurement pattern MP that may be used to evaluate the overlay shift of the bonded wafers. In other words, if there is a shift in the position of the top wafer 100 or bottom wafer 200, then the measurement pattern MP may be used to evaluate the amount of shift of the bonded wafers.

Figure 2C:
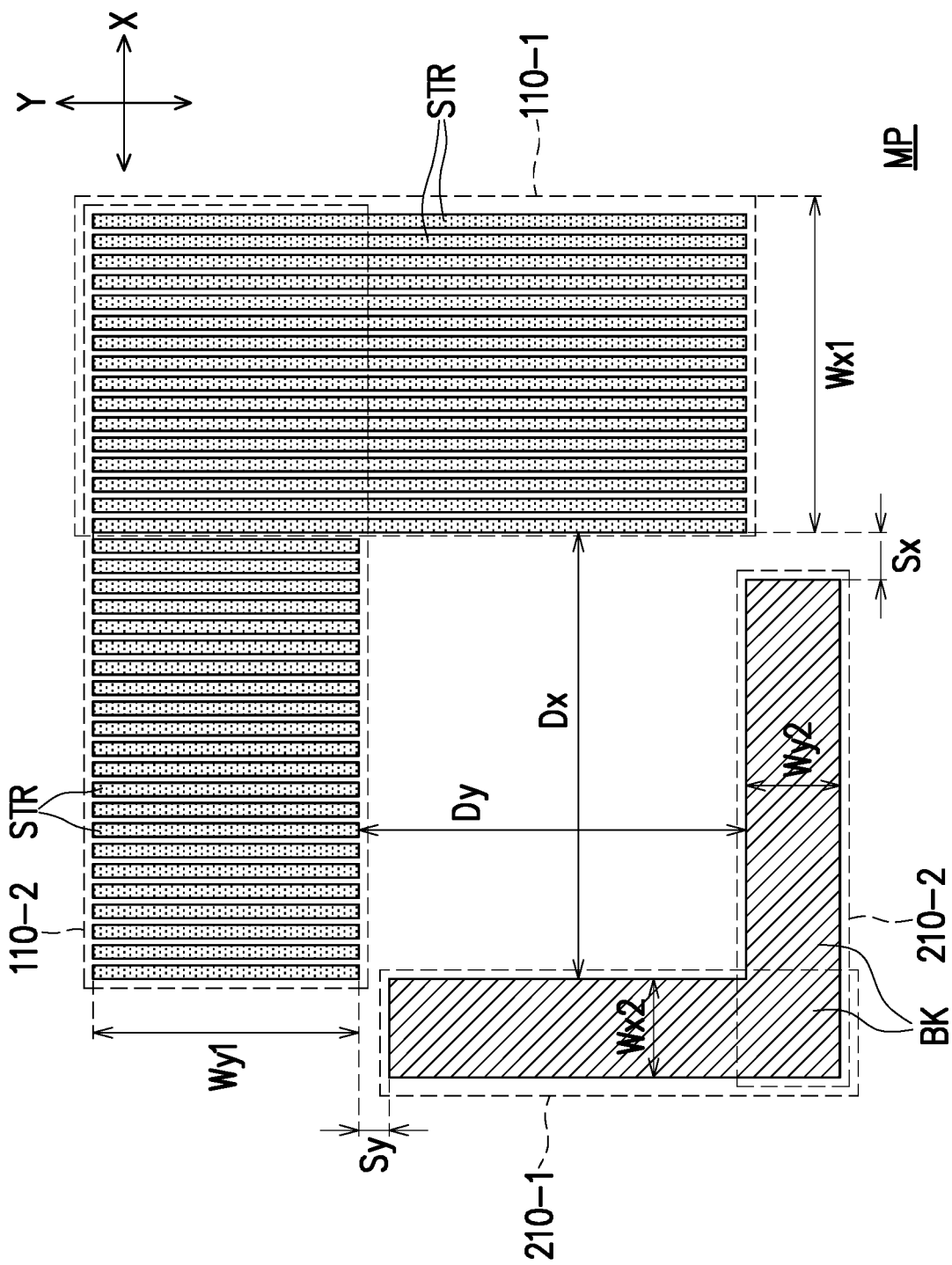

FIG. 2C is a schematic top view of the measurement pattern MP of the bonded wafers according to one exemplary embodiment of the present disclosure. As illustrated in FIG. 2C, the measurement pattern MP includes the top wafer pattern 110 of the top wafer 100 and the bottom wafer pattern 210 of the bottom wafer 200. In some embodiments, the top wafer pattern 110 includes a first portion 110-1 and a second portion 110-2, wherein the first portion 110-1 and the second portion 110-2 constitute an upside-down L-shape pattern. Furthermore, the bottom wafer pattern 210 includes a first part 210-1 and a second part 210-2, wherein the first part 210-1 and the second part 210-2 constitute an L-shaped pattern. In the exemplary embodiment, the top wafer 100 is bonded to the bottom wafer 200 so that the first portion 110-1 of the top wafer pattern 110 faces the first part 210-1 of the bottom wafer pattern 210, and that the second portion 110-2 of the top wafer pattern 110 faces the second part 210-2 of the bottom wafer pattern 210.

In the exemplary embodiment, the top wafer pattern 110 (inclusive of the first portion 110-1 and the second portion 110-2) includes a plurality of stripe patterns STR, while the bottom wafer pattern 210 (inclusive of the first part 210-1 and the second part 210-2) includes a bulk pattern BK. However, the disclosure is not limited thereto. In some alternative embodiments, one of the top wafer pattern 110 and the bottom wafer pattern 210 includes the plurality of stripe patterns STR, and another one of the top wafer pattern 110 and the bottom wafer pattern 210 includes the bulk pattern BK. In some other embodiments, both the top wafer pattern 110 and the bottom wafer pattern 210 includes the plurality of stripe patterns STR. In yet another embodiment, both the top wafer pattern 110 and the bottom wafer pattern 210 includes bulk patterns BK.

Based on the different embodiments, it should be noted that the design of the top wafer pattern 110 and the bottom wafer pattern 210 is not particularly limited as long as the patterns may be measured optically using an automatic optical inspection (AOI) device. Furthermore, it should be noted that whether the top wafer pattern 110 and the bottom wafer pattern 210 are stripe patterns STR or bulk patterns BK, this will depend on the material used for forming the patterns. For example, when the top wafer pattern 110 or bottom wafer pattern 210 is a dielectric material pattern (or polymer material pattern), then the top wafer pattern 110/bottom wafer pattern 210 will include the stripe patterns STR so that the patterns may be optically measured. On the other hand, when the dielectric material pattern (or polymer material pattern) is not made into stripe form, optical measurement of the dielectric material pattern will be difficult. Furthermore, in some embodiments, when the top wafer pattern 110 or bottom wafer pattern 210 is a metallic material pattern, then the top wafer pattern 110/bottom wafer pattern 210 may include bulk patterns BK that may be directly measured using the automatic optical inspection (AOI) device.

As further illustrated in FIG. 2C, in some embodiments, the first portion 110-1 of the top wafer pattern 110 has a width Wx1 measured along a first axis (the X-axis), while the second portion 110-2 of the top wafer pattern 110 has a width Wy1 measured along a second axis (the Y-axis). In certain embodiments, the first part 210-1 of the bottom wafer pattern 210 has a width Wx2 measured along a first axis (the X-axis), while the second part 210-2 of the bottom wafer pattern 210 has a width Wy2 measured along a second axis (the Y-axis). The width Wx1 may be larger than the width Wx2, while the width Wy1 may be larger than the width Wy2. In some embodiments, when the top wafer 100 is bonded to the bottom wafer 200 without overlay shift, then the first portion 110-1 of the top wafer pattern 110 and the first part 210-1 of the bottom wafer pattern 210 will be separated by a target distance Dx. Furthermore, the second portion 110-2 of the top wafer pattern 110 and the second part 210-2 of the bottom wafer pattern 210 will be separated by a target distance Dy.

Furthermore, when measuring a shift of the first portion 110-1 of the top wafer 100 relative to the first part 210-1 of the bottom wafer 200 along a first axis (X-axis) by using an optical inspection device, such as an automatic optical inspection device that measures the optical patterns of the top wafer pattern 110 and the bottom wafer pattern 210 automatically, the automatic optical inspection device satisfies the following measurement formulas for measuring overlay shift of the bonded wafers:

$$Tx > Dx - Sx;$$

$$Tx < Dx - Sx + Wx2;$$

$$Tx > Sx;$$

$$Tx < Dx - Sx + Wx1;$$

wherein, Tx represents a searching distance (searching Torrance setting) for finding an end-point of the first portion 110-1 of the top wafer pattern 110 or an end-point of the first part 210-1 of the bottom wafer pattern 210 using an automatic optical inspection device; and Sx represents an actual shifting amount of the first portion 110-1 of the top wafer pattern 110 along the first axis (X-axis) relative to the target distance Dx.

Similarly, when measuring a shift of the second portion 110-2 of the top wafer 100 relative to the second part 210-2 of the bottom wafer 200 along a second axis (Y-axis) by using the automatic optical inspection device, the automatic optical inspection device satisfies the following measurement formulas for measuring overlay shift of the bonded wafers:

$$Ty > Dy - Sy;$$

$$Ty < Dy - Sy + Wy2;$$

$Ty > Sy$;

$Ty < Dy - Sy + Wy1$;

wherein, Ty represents a searching distance for finding an end-point of the second portion 110-2 of the top wafer pattern 110 or an end-point of the second part 210-2 of the bottom wafer pattern 210 using an automatic optical inspection device; and Sy represents an actual shifting amount of the second portion 110-2 of the top wafer pattern 110 along the second axis (Y-axis) relative to the target distance Dy.

The detailed method of measuring the overlay shift of the bonded wafers will be described with reference to FIG. 3A to FIG. 6D. Referring to step S20 in FIG. 1 and as illustrated in FIG. 3A to FIG. 4D, a shift of the first portion 110-1 of the top wafer 100 relative to the first part 210-1 of the bottom wafer 200 along a first axis (X-axis) is measured by performing a first measurement using an automatic optical inspection device.

Figure 3A:
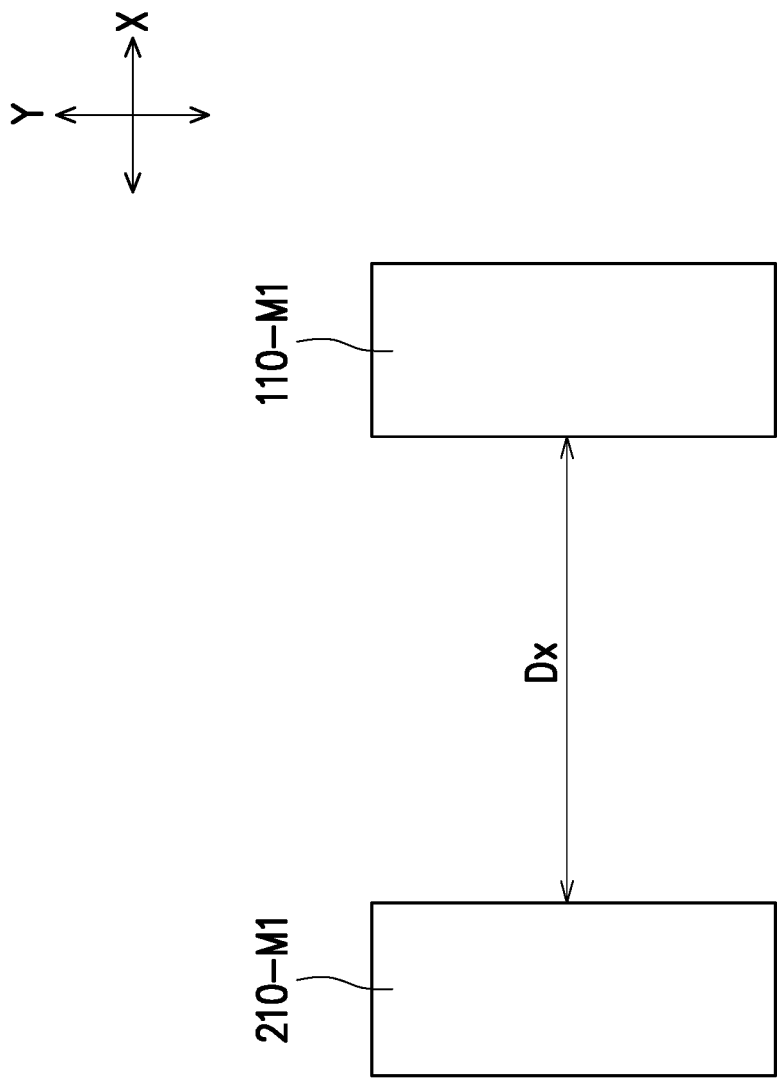

For example, referring to FIG. 3A, during the first measurement, a target distance Dx is set in an automatic optical inspection device, wherein the target distance Dx is a distance between the first portion 110-1 of the top wafer pattern 110 and the first part 210-1 of the bottom wafer pattern 210 when no shifting of the bonded wafers along the first axis (X-axis) exists. In the exemplary embodiment, the target distance Dx is set by using a standard module having a model first portion 110-M1 and a model first part 210-M1 placed at positions corresponding to the first portion 110-1 and the first part 210-1 where no overlay shift exists.

Figure 3B:
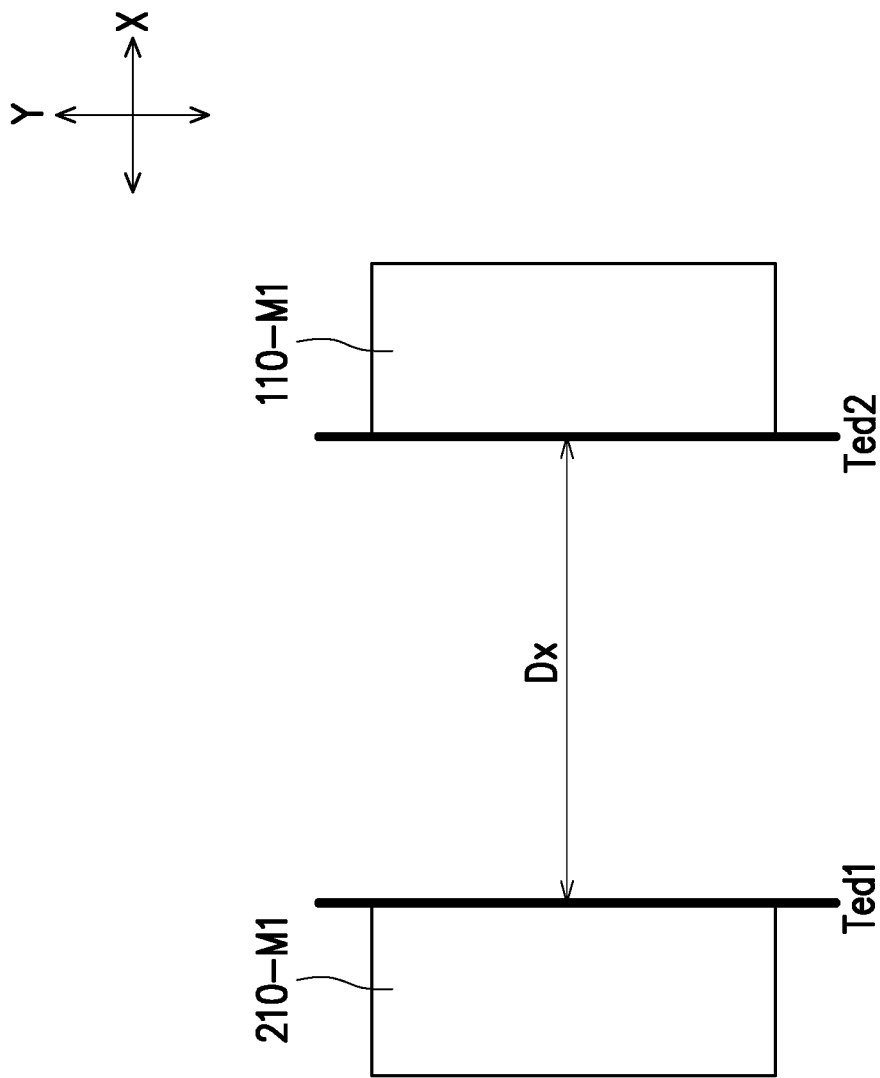

Referring to FIG. 3B, by using the standard module having the model first portion 110-M1 and the model first part 210-M1 as references, a first target end-point Ted1 and a second target end-point Ted2 may be set in the automatic optical inspection device. As shown in FIG. 3B, the first target end-point Ted1 and the second target end-point Ted2 corresponds to the relative positions (edges) of the first part 210-1 of the bottom wafer 200 and the first portion 110-1 of the top wafer 100 when no shifting of the bonded wafers exists.

Figure 4A:
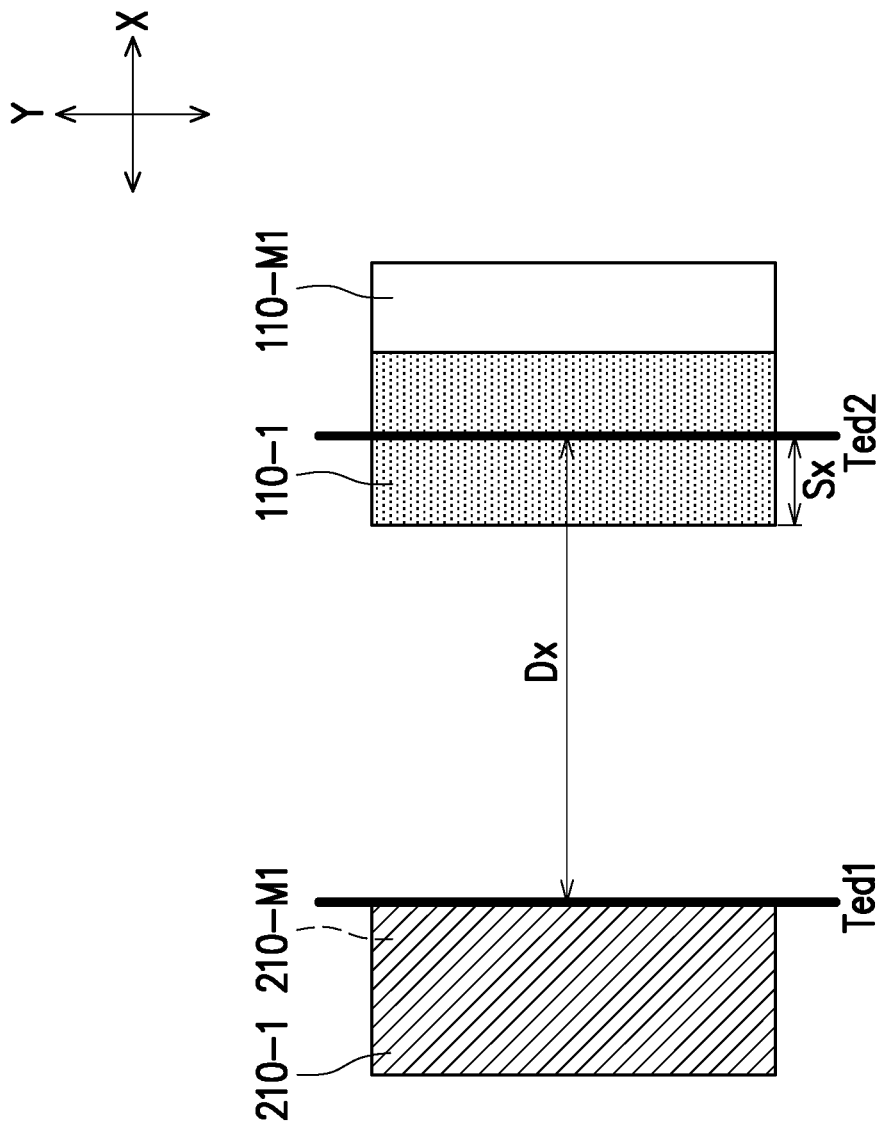

Referring to FIG. 4A, after setting the target distance Dx, the first target end-point Ted1 and the second target end-point Ted2 in the automatic optical inspection device, the bonded wafers may be provided to the automatic optical inspection device. Thereafter, the actual shifting amount Sx of the bonded wafers having the measurement pattern MP with the first portion 110-1 and the first part 210-1 may be measured. In the exemplary embodiment, in the bonded wafer, the first part 210-1 of the bottom wafer pattern 210 is aligned with the model first part 210-M1 of the standard module so that any shift of the first portion 110-1 of the top wafer pattern 110 relative to the second target end-point Ted2 may be determined. In other words, the position of the first part 210-1 of the bottom wafer 200 is fixed to the standard module to observe the shift of the top wafer 100. However, the disclosure is not limited thereto. In another embodiment, the position of the first portion 110-1 of the top wafer 100 is fixed to the standard module to observe the shift of the bottom wafer 200. That is, the shift of the bonded wafers may be determined by fixing the position of any one of the top wafer pattern 110 or the bottom wafer pattern 210 to the standard module to observe the shift of the other.

Figure 4B:
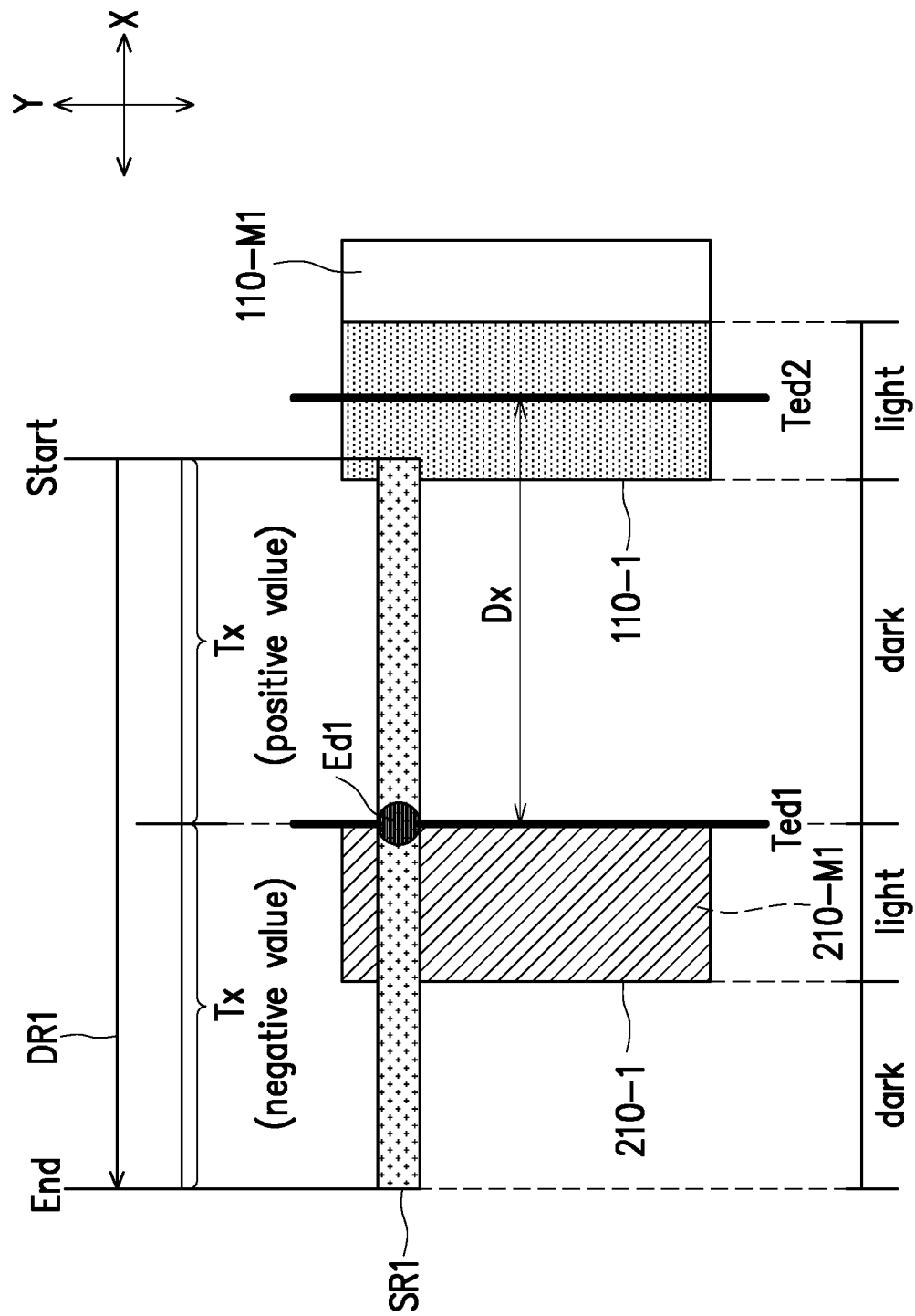

Referring to step S21 in FIG. 1 and as illustrated in FIG. 4B, a first search SR1 is performed based on a searching distance Tx to find a first end-point Ed1 of the first part 210-1 of the bottom wafer pattern 210 by detecting a dark to light brightness change of the measured pattern. The searching distance Tx may be preliminary set in the automatic optical inspection device. In some embodiments, the first search SR1 is performed by using the first target end-point Ted1 as a center point of search and performing a positive value to negative value search with the searching distance Tx. For example, in one embodiment, if the searching distance Tx is set to be 126 μm in the automatic optical inspection device, then a ±126 μm search based on the first target end-point Ted1 as the center point of search will be performed.

Furthermore, in the exemplary embodiment, the first search SR1 is performed by using the automatic optical inspection device to scan along a first direction DR1 of the first axis (X-axis) to detect the dark to light brightness change. In the automatic optical inspection device, a light pattern will be observed when the device scans over the top wafer pattern 110 and the bottom wafer pattern 210, while a dark pattern will be observed when the device scans over areas other than the top wafer pattern 110 and the bottom wafer pattern 210. Therefore, during the start of the first search SR1, a light pattern will be observed due to the scanning over areas of the first portion 110-1. Thereafter, a dark pattern, a light pattern and another dark pattern will be consecutively observed during the first search SR1. In the exemplary embodiment, the first end-point Ed1 is found when a first "dark to light" brightness change is observed. On the other hand, if a "light to dark" brightness change is first observed, the automatic optical inspection device will determine that this brightness change is not the desired "end-point", and will continue scanning along the first direction DR1 to find the first "dark to light" transition.

Figure 4C:
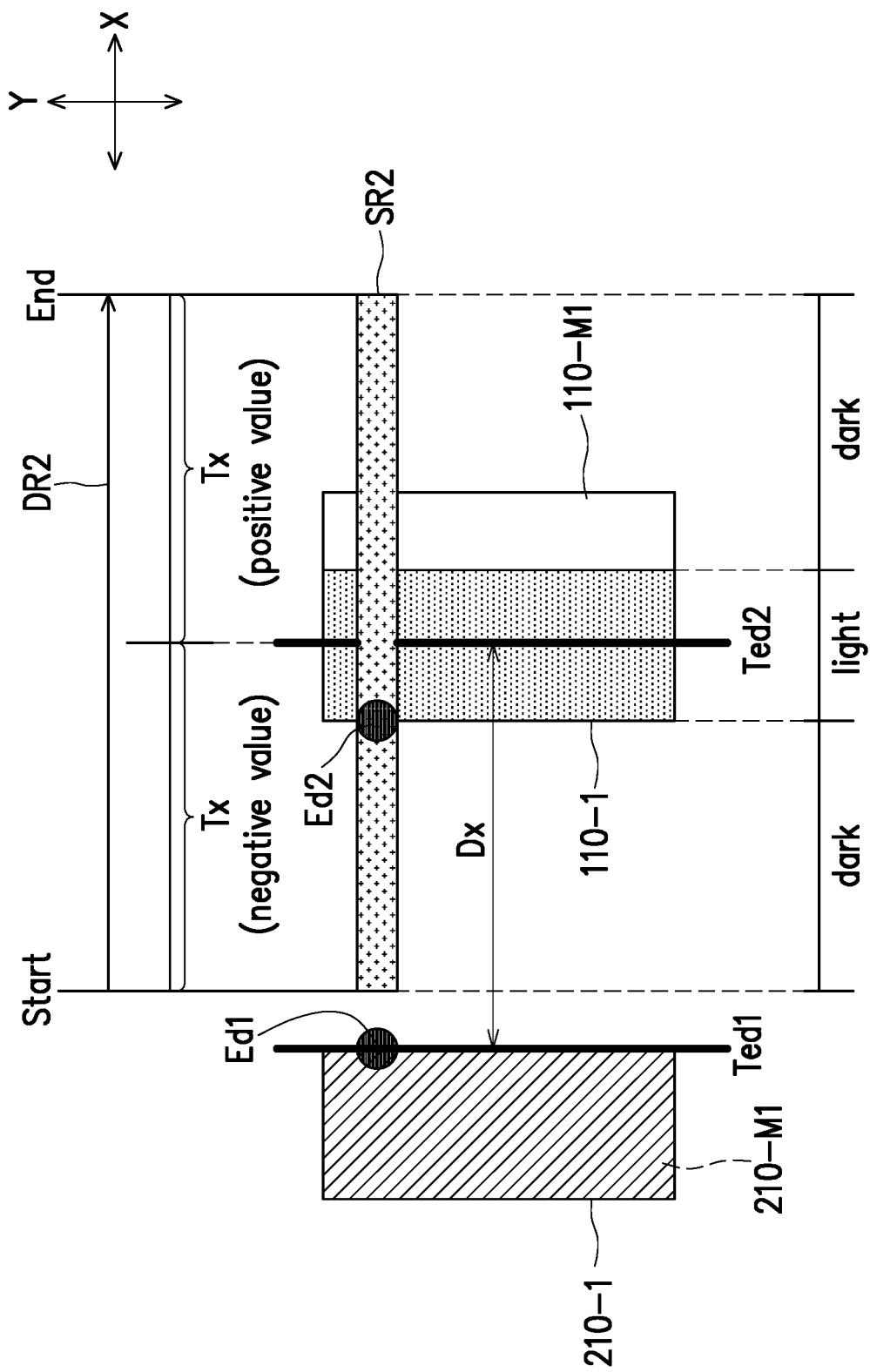

Referring to step S22 in FIG. 1 and as illustrated in FIG. 4C, after obtaining the first end-point Ed1, a second search SR2 is performed based on the same searching distance Tx to find a second end-point Ed2 of the first portion 110-1 of the top wafer pattern 110 by detecting a dark to light brightness change of the measured pattern. In some embodiments, the second search SR2 is performed by using the second target end-point Ted2 as a center point of search and performing a negative value to positive value search with the searching distance Tx. Furthermore, the second search SR2 is performed by using the automatic optical inspection device to scan along a second direction DR2 of the first axis (X-axis) to detect the first dark to light brightness change, wherein the second direction DR2 is opposite to the first direction DR1.

In the exemplary embodiment, during the start of the second search SR2, a dark pattern will be observed due to the scanning over areas other than the top wafer pattern 110 and the bottom wafer pattern 210. Thereafter, a light pattern and a dark pattern will be consecutively observed during the second search SR2, and the first "dark to light" brightness change will be determined as the second end-point Ed2.

Figure 4D:
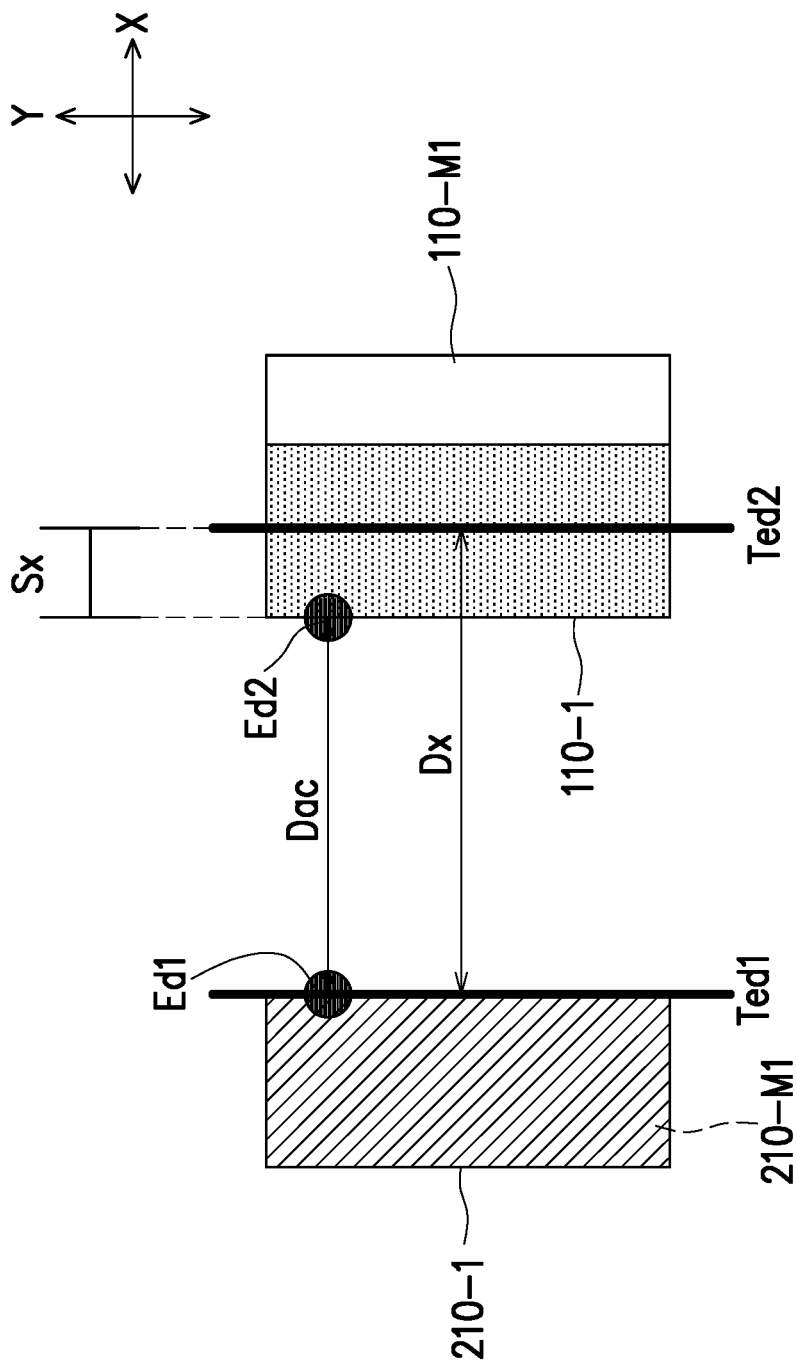

Referring to step S23 in FIG. 1 and as illustrated in FIG. 4D, in a subsequent step, the distance between first end-point Ed1 and the second end-point Ed2 is calculated to determine the shift of the first portion 110-1 of the top wafer 100 relative to the first part 210-1 of the bottom wafer 200 along the first axis (X-axis). For example, in some embodiments, the distance between first end-point Ed1 and the second end-point Ed2 is calculated to obtain an actual distance Dac between the first portion 110-1 of the top wafer pattern 110 and the first part 210-1 of the bottom wafer pattern 210. Thereafter, the difference between the actual distance Dac and the target distance Dx is determined to obtain an actual shifting amount Sx of the first portion 110-1 of the top wafer pattern 110 relative to the target distance Dx.

In some embodiments, the automatic optical inspection device calculates the actual distance Dac by counting the number of pixels between the first end-point Ed1 and the second end-point Ed2, and the exact distance may be determined by knowing the pixel size. In certain embodiments, after determining the actual shifting amount Sx, the automatic optical inspection device reports the actual shifting amount Sx (along the X-axis) to the SPC (statistical process control) system for controlling the post wafer-bonding process.

Referring to step S30 in FIG. 1 and as illustrated in FIG. 5A to FIG. 6D, a shift of the second portion 110-2 of the top wafer 100 relative to the second part 210-2 of the bottom wafer 200 along a second axis (Y-axis) is measured by performing a second measurement using the automatic optical inspection device.

Figure 5A:
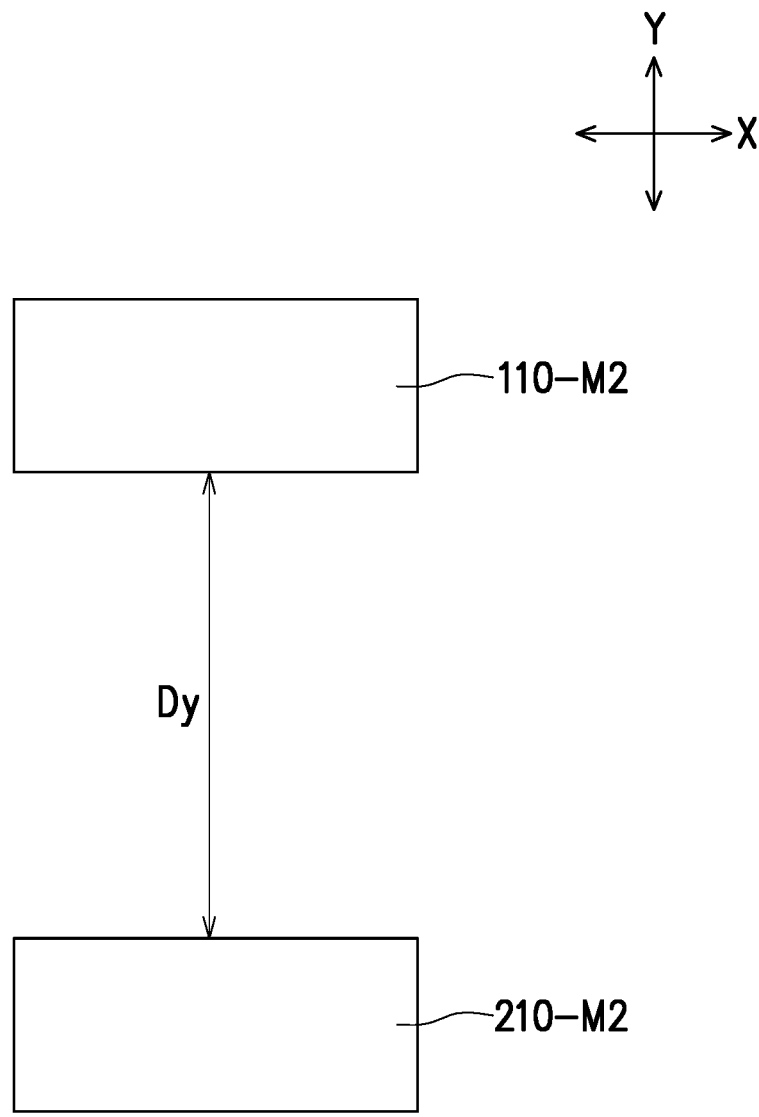

For example, referring to FIG. 5A, during the second measurement, a target distance Dy is set in an automatic optical inspection device, wherein the target distance Dy is a distance between the second portion 110-2 of the top wafer pattern 110 and the second part 210-2 of the bottom wafer pattern 210 when no shifting of the bonded wafers along the first axis (X-axis) exists. In the exemplary embodiment, the target distance Dy is set by using a standard module having a model second portion 110-M2 and a model second part 210-M2 placed at positions corresponding to the second portion 110-2 and the second part 210-2 where no overlay shift exists. The target distance Dy may be the same or different than the target distance Dx, which may be adjusted based on design requirements.

Figure 5B:
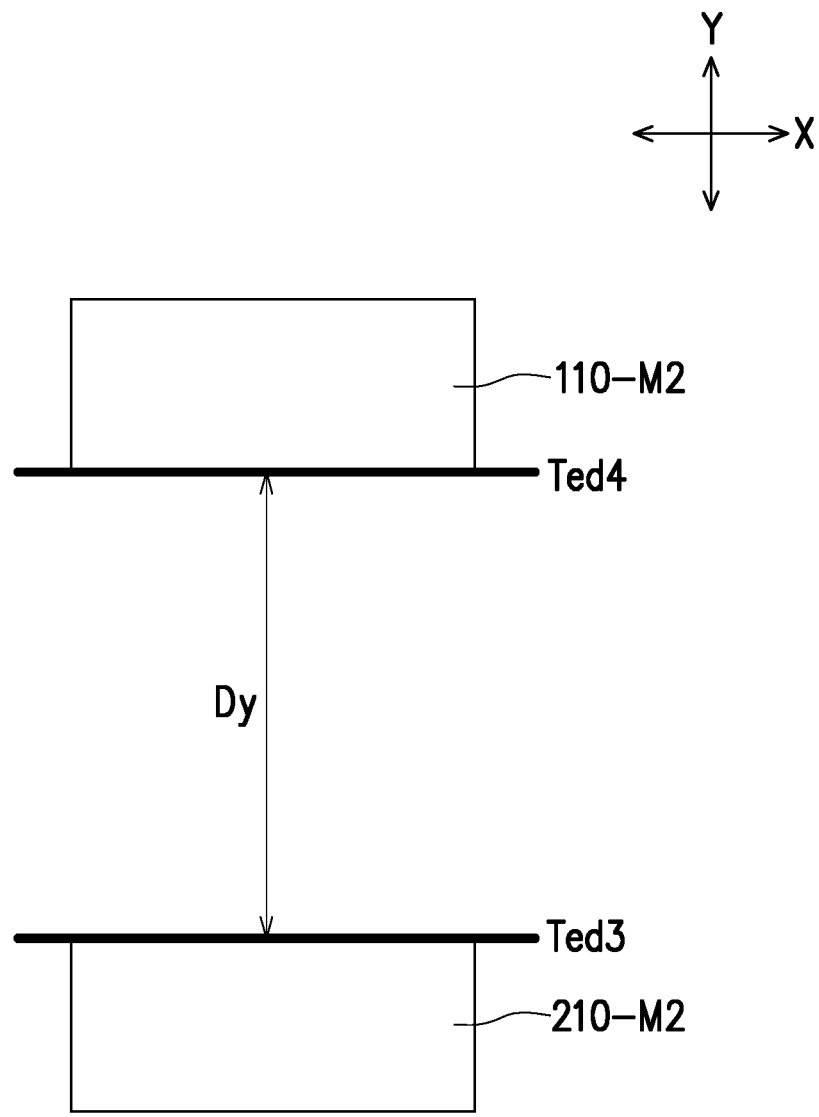

Referring to FIG. 5B, by using the standard module having the model second portion 110-M2 and the model second part 210-M2 as references, a third target end-point Ted3 and a fourth target end-point Ted4 may be set in the automatic optical inspection device. As shown in FIG. 5B, the third target end-point Ted3 and the fourth target end-point Ted4 corresponds to the relative positions (edges) of the second part 210-2 of the bottom wafer 200 and the second portion 110-2 of the top wafer 100 when no shifting of the bonded wafers exists.

Figure 6A:
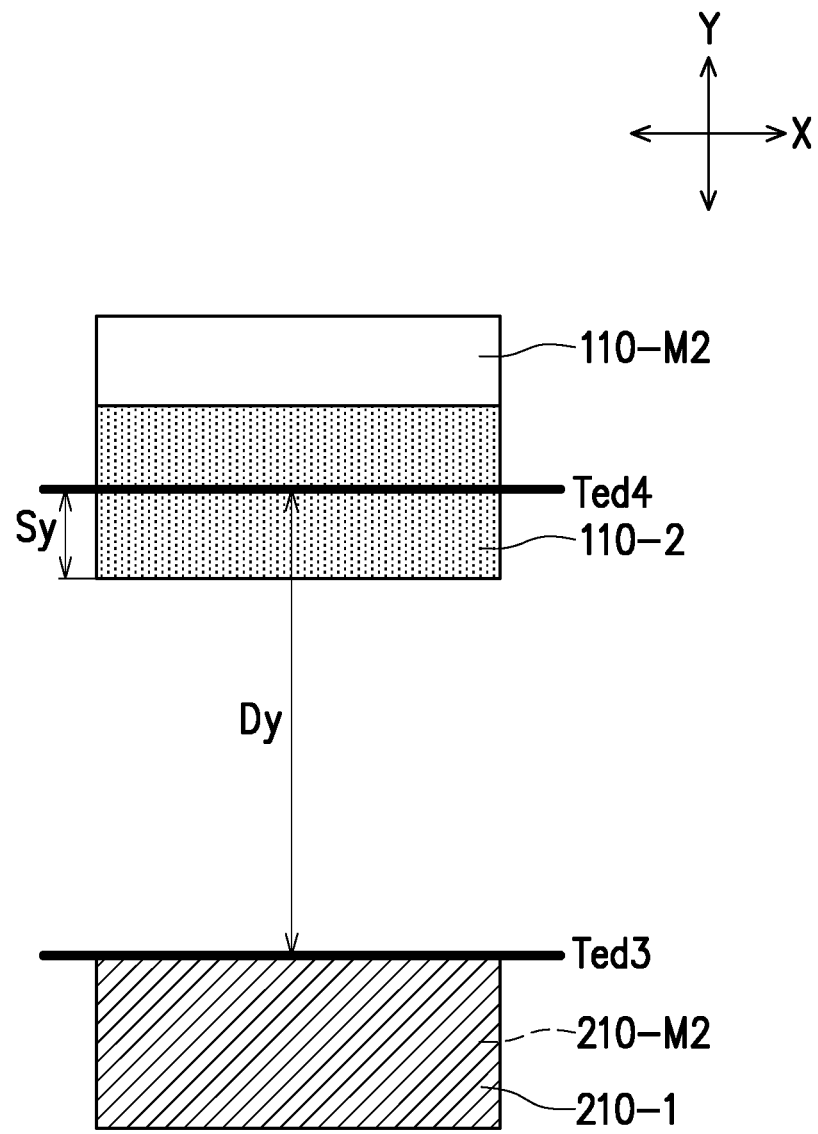

Referring to FIG. 6A, after setting the target distance Dy, the third target end-point Ted3 and the fourth target end-point Ted4 in the automatic optical inspection device, the actual shifting amount Sy of the bonded wafers having the measurement pattern MP with the second portion 110-2 and the second part 210-2 may be measured. In the exemplary embodiment, in the bonded wafer, the second part 210-2 of the bottom wafer pattern 210 is aligned with the model second part 210-M2 of the standard module so that any shift of the second portion 110-2 of the top wafer pattern 110 relative to the fourth target end-point Ted4 may be determined. In other words, the position of the second part 210-2 of the bottom wafer 200 is fixed to the standard module to observe the shift of the top wafer 100. However, the disclosure is not limited thereto, and the shift of the bonded wafers may be determined by fixing the position of any one of the top wafer pattern 110 or the bottom wafer pattern 210 to the standard module to observe the shift of the other.

Figure 6B:
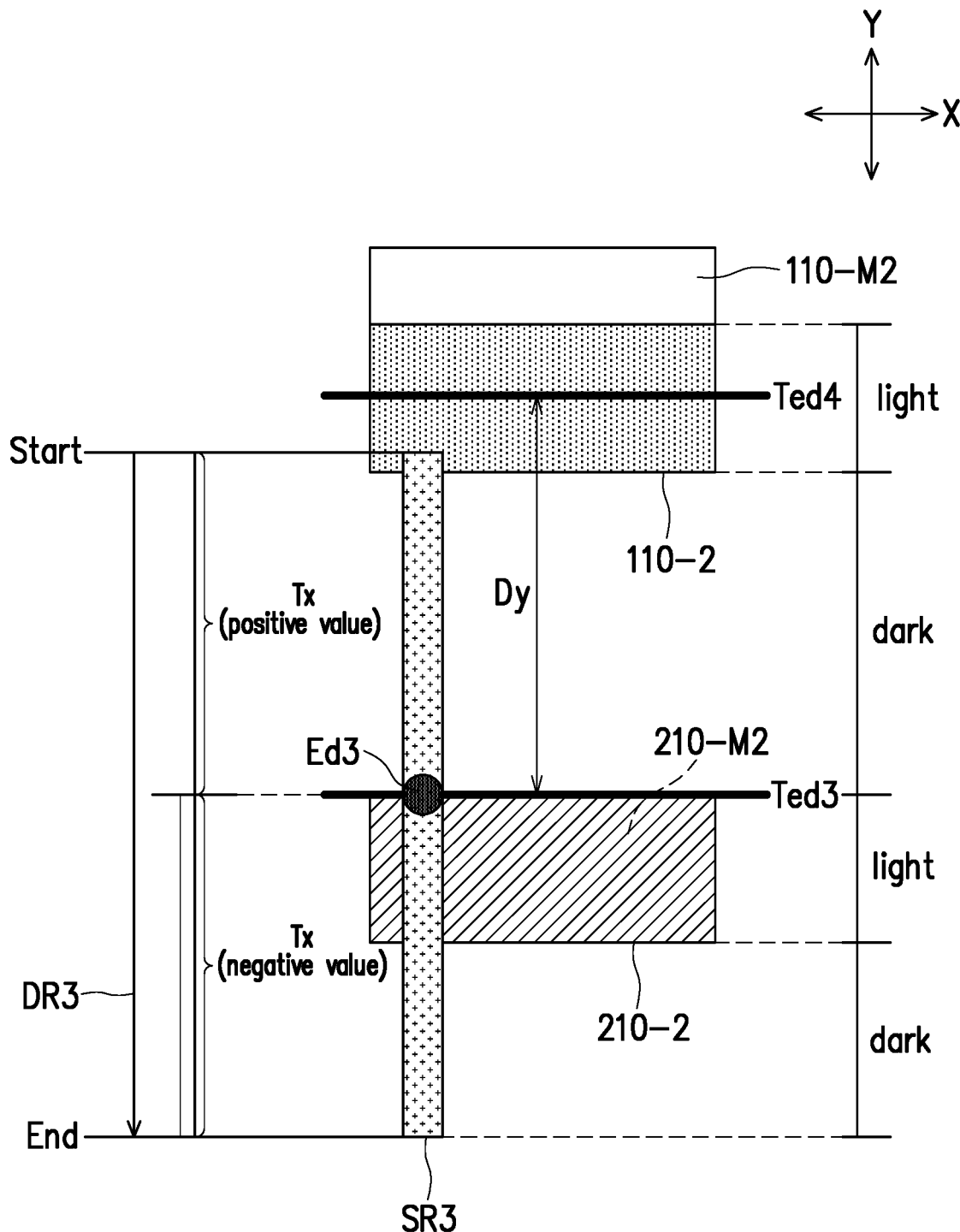

Referring to FIG. 6B, in a subsequent step, a third search SR3 is performed based on a searching distance Ty to find a third end-point Ed3 of the second part 210-2 of the bottom wafer pattern 210 by detecting a dark to light brightness change of the measured pattern. The searching distance Ty may be preliminary set in the automatic optical inspection device, and may be different or same as the searching distance Tx depending on the actual dimensions of the top wafer pattern 110 and the bottom wafer pattern 210. In some embodiments, the third search SR3 is performed by using the third target end-point Ted3 as a center point of search and performing a positive value to negative value search with the searching distance Ty.

Furthermore, in the exemplary embodiment, the third search SR3 is performed by using the automatic optical inspection device to scan along a third direction DR3 of the second axis (Y-axis) to detect the dark to light brightness change. For example, during the start of the third search SR3, a light pattern will be observed due to the scanning over areas of the second portion 110-2. Thereafter, a dark pattern, a light pattern and another dark pattern will be consecutively observed during the third search SR3, and the first "dark to light" brightness change will be determined as the third end-point Ed3.

Figure 6C:
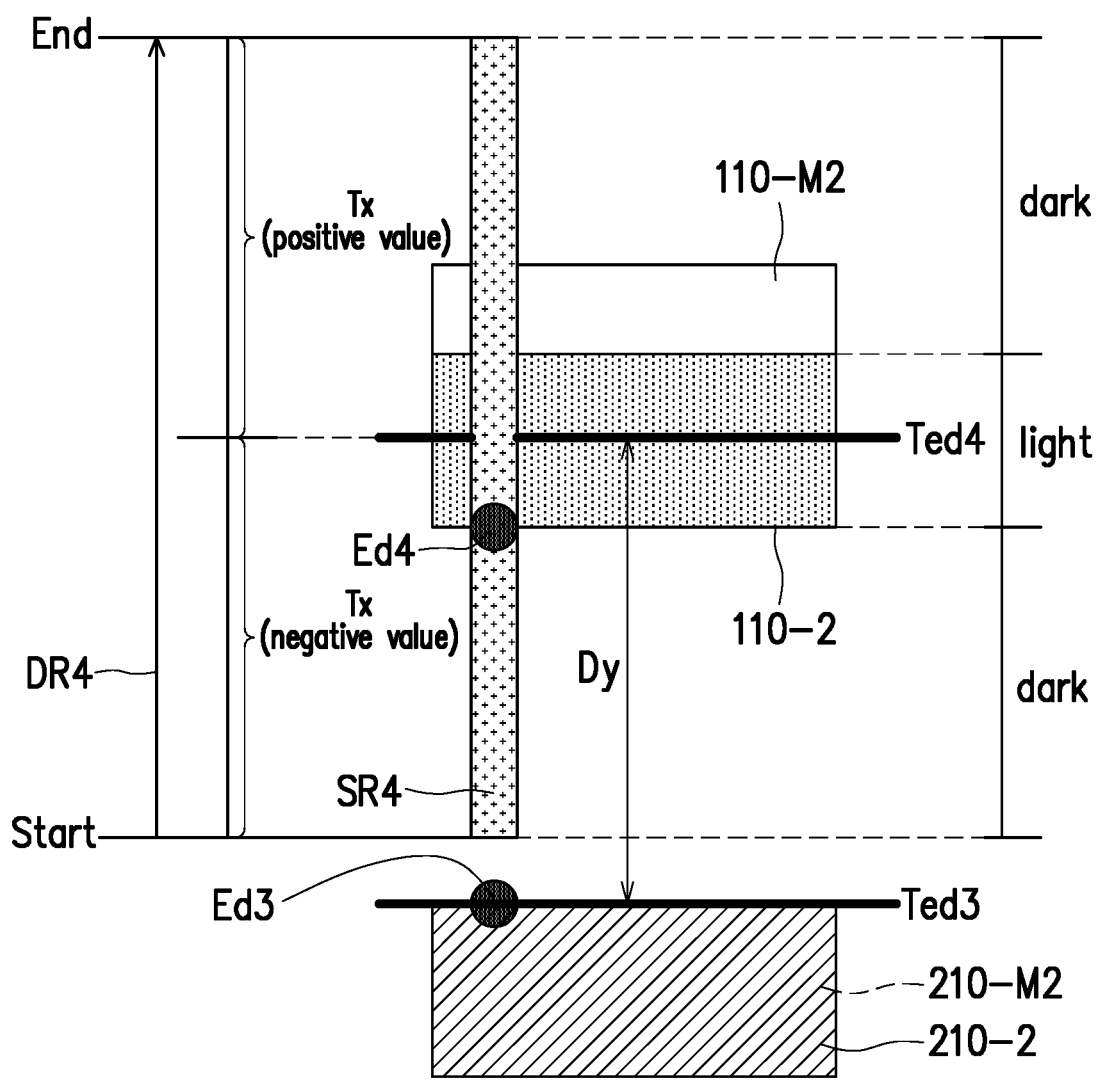

Referring to FIG. 6C, after obtaining the third end-point Ed3, a fourth search SR4 is performed based on the same searching distance Ty to find a fourth end-point Ed4 of the second portion 110-2 of the top wafer pattern 110 by detecting a dark to light brightness change of the measured pattern. In some embodiments, the fourth search SR4 is performed by using the fourth target end-point Ted4 as a center point of search and performing a positive value to negative value search with the searching distance Ty. Furthermore, the fourth search SR4 is performed by using the automatic optical inspection device to scan along a fourth direction DR4 of the second axis (Y-axis) to detect the first dark to light brightness change, wherein the fourth direction DR4 is opposite to the third direction DR3.

In the exemplary embodiment, during the start of the fourth search SR4, a dark pattern will be observed due to the scanning over areas other than the top wafer pattern 110 and the bottom wafer pattern 210. Thereafter, a light pattern and a dark pattern will be consecutively observed during the fourth search SR4, and the first "dark to light" brightness change will be determined as the fourth end-point Ed4.

Figure 6D:
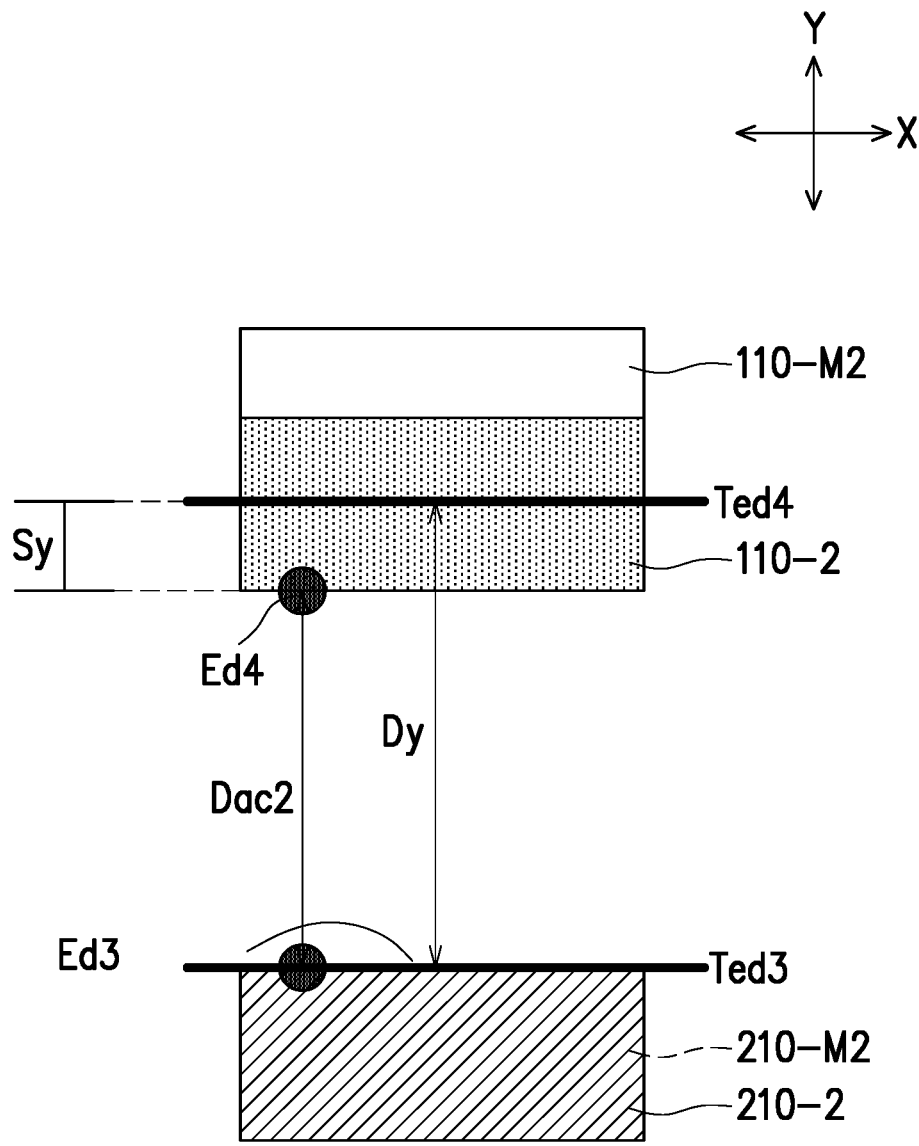

Referring to FIG. 6D, in a subsequent step, the distance between third end-point Ed3 and the fourth end-point Ed4 is calculated to determine the shift of the second portion 110-2 of the top wafer 100 relative to the second part 210-2 of the bottom wafer 200 along the second axis (Y-axis). For example, in some embodiments, the distance between third end-point Ed3 and the fourth end-point Ed4 is calculated to obtain an actual distance Dac2 between the second portion 110-2 of the top wafer pattern 110 and the second part 210-2 of the bottom wafer pattern 210. Thereafter, the difference between the actual distance Dac2 and the target distance Dy is determined to obtain an actual shifting amount Sy of the second portion 110-2 of the top wafer pattern 110 relative to the target distance Dy.

In some embodiments, the automatic optical inspection device calculates the actual distance Dac2 by counting the number of pixels between the third end-point Ed3 and the fourth end-point Ed4, and the exact distance may be determined by knowing the pixel size. In certain embodiments, after determining the actual shifting amount Sy, the automatic optical inspection device reports the actual shifting amount Sy (along the Y axis) to the SPC (statistical process control) system for controlling the post wafer-bonding process. Up to here, a method for measuring overlay shift of bonded wafers according to some exemplary embodiments of the present disclosure is accomplished.

As described above, the automatic optical inspection device satisfies certain measurement formulas for measuring overlay shift of the bonded wafers, otherwise the measurement will be inaccurate. Examples for deriving the measurement formulas is explained with reference to FIG. 7 and FIG. 8.

Figure 7:
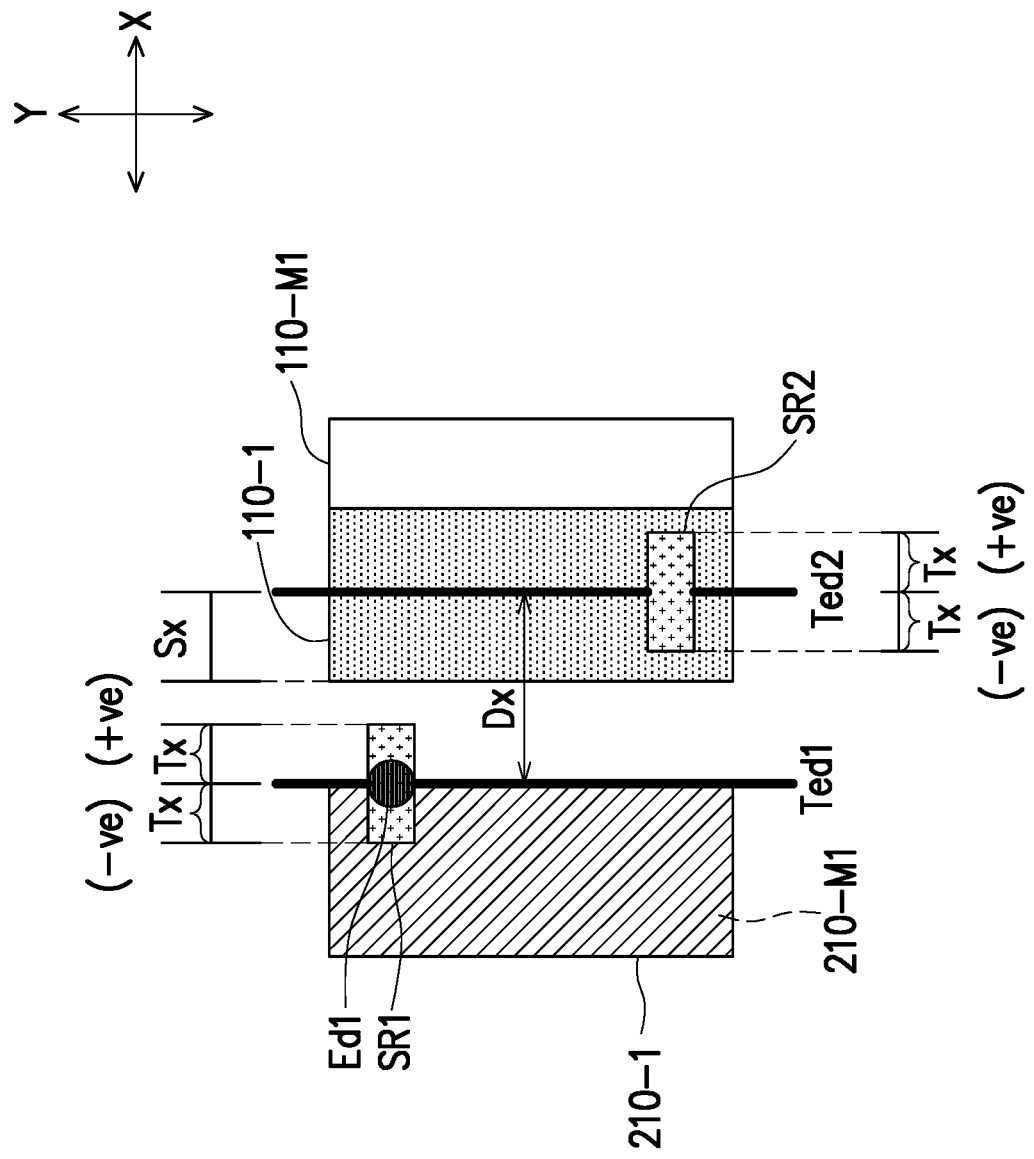
FIG. 7 is a schematic top view of one stage in a method for measuring overlay shift of bonded wafers according to some comparative embodiments of the present disclosure.

FIG. 7 is a schematic top view of one stage in a method for measuring overlay shift of bonded wafers according to some comparative embodiments of the present disclosure. For example, the method is performed according to the steps described in FIG. 4B and FIG. 4C above. The comparative embodiment in FIG. 7 explains why the measurement formulas of Tx>Dx−Sx (searching distance>target distance−actual shifting amount) and Tx>Sx (searching distance>actual shifting amount) should be satisfied.

As illustrated in FIG. 7, in some embodiments, when the searching distance Tx is set to be smaller than a distance difference between the target distance Dx and the actual shifting amount Sx (Dx-Sx), and when the searching distance Tx is set to be smaller than the actual shifting amount Sx, then the accurate overlay shifting amount cannot be measured. For example, as shown in FIG. 7, although the first end-point Ed1 can be accurately found during the first search SR1, it can be seen that the second search SR2 failed to find any end-point. The reason being that the start of the second search SR2 (with searching distance Tx) is located at a position overlapped with the first portion 110-1 of the top wafer pattern 110. As such, no "dark to light" brightness change can be observed, and the actual shifting amount Sx cannot be properly determined.

Therefore, taking the first search SR1 and the second search SR2 into consideration, the measurement formulas along the first axis (X-axis) should satisfy the following relationship: Tx>Dx−Sx (searching distance>target distance−actual shifting amount) and Tx>Sx (searching distance>actual shifting amount). Similarly, the measurement formulas along the second axis (Y-axis) should satisfy the following relationship: Ty>Dy−Sy (searching distance>target distance−actual shifting amount) and Ty>Sy (searching distance>actual shifting amount).

Figure 8:
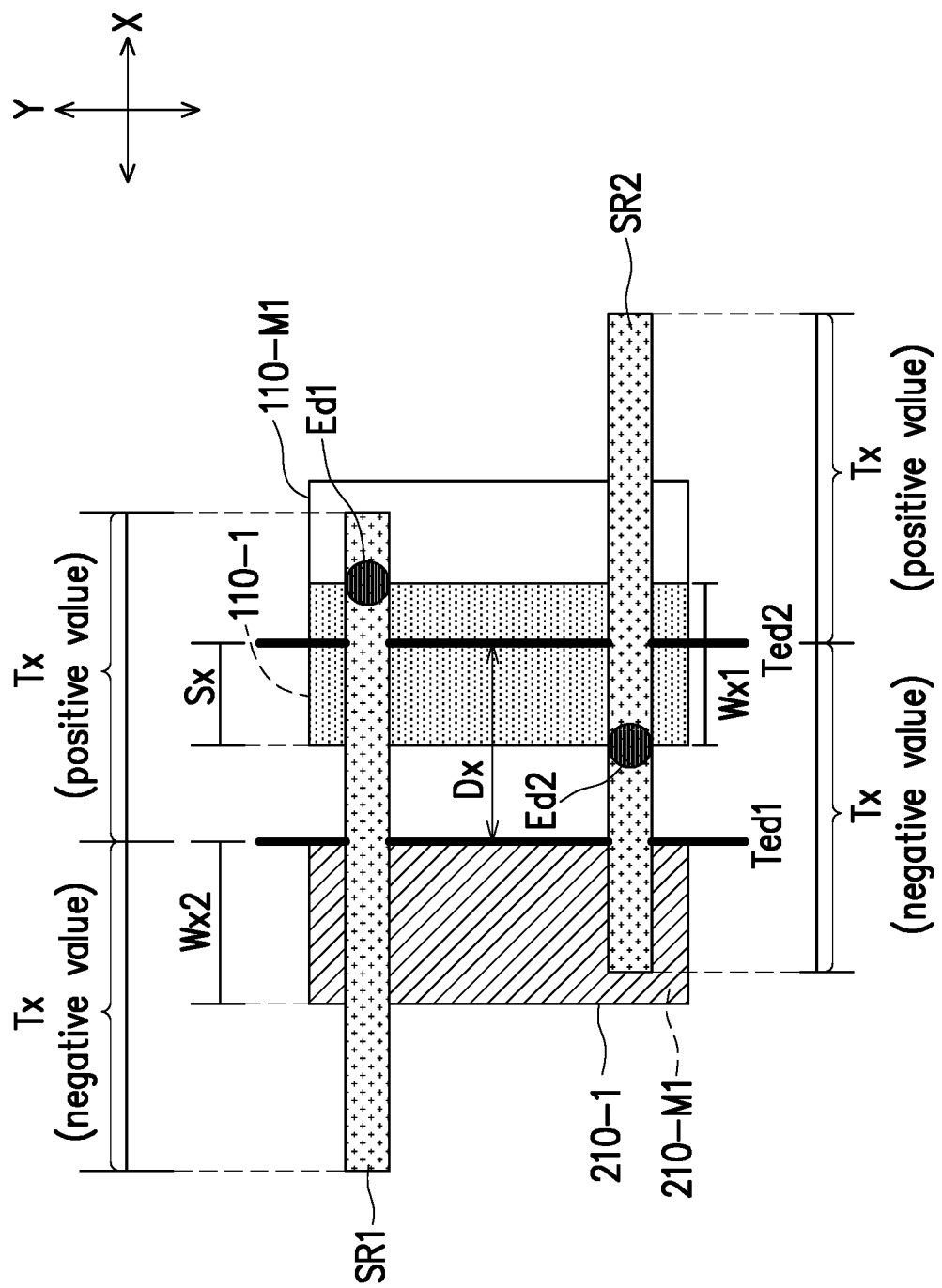
FIG. 8 is a schematic top view of one stage in a method for measuring overlay shift of bonded wafers according to some comparative embodiments of the present disclosure.

FIG. 8 is a schematic top view of one stage in a method for measuring overlay shift of bonded wafers according to some comparative embodiments of the present disclosure. For example, the method is performed according to the steps described in FIG. 4B and FIG. 4C above. The comparative embodiment in FIG. 5 explains why the measurement formulas of Tx<Dx−Sx+Wx2 (searching distance>target distance−actual shifting amount+width Wx2 of the first part 210-1) and Tx<Dx−Sx+Wx1 (searching distance>target distance−actual shifting amount+width Wx1 of the first portion 110-1) should be satisfied.

As illustrated in FIG. 8, in some embodiments, when the searching distance Tx is set to be greater than Dx−Sx+Wx2 and greater than Dx−Sx+Wx1, then the accurate overlay shifting amount cannot be measured. For example, as shown in FIG. 8, although the second end-point Ed1 can be accurately found during the second search SR2, it can be seen that first search SR1 failed to correctly determine the first end-point Ed1 of the first part 210-1. The reason being that the searching distance Tx is too large, and the first search SR1 would erroneously determine the first "dark to light" brightness change as the first end-point Ed1. As such, the actual shifting amount Sx cannot be properly calculated.

Therefore, taking the first search SR1 and the second search SR2 into consideration, the measurement formulas along the first axis (X-axis) should also satisfy the following relationship: Tx<Dx−Sx+Wx2 (searching distance>target distance−actual shifting amount+width Wx2 of the first part 210-1) and Tx<Dx−Sx+Wx1 (searching distance>target distance−actual shifting amount+width Wx1 of the first portion 110-1). Similarly, the measurement formulas along the second axis (Y-axis) should satisfy the following relationship: Ty<Dy−Sy+Wy2 (searching distance>target distance−actual shifting amount+width Wy2 of the second part 210-2) and Ty<Dy−Sy+Wy1 (searching distance>target distance−actual shifting amount+width Wy1 of the second portion 110-2).

By knowing the following measurement formulas along the first axis (X-axis):

$Tx>Dx-Sx;$ $Tx<Dx-Sx+Wx2;$ $Tx>Sx;$ $Tx<Dx-Sx+Wx1;$ the following relational expression of the measurement formulas can be further derived:

$Sx>Dx-Tx;$ $Sx<Dx-Tx+Wx2;$ $Sx<Tx;$ $Sx<Dx-Tx+Wx1.$

Similarly, by knowing the following measurement formulas along the second axis (Y-axis):

$Ty>Dy-Sy;$ $Ty<Dy-Sy+Wy2;$ $Ty>Sy;$ $Ty<Dy-Sy+Wy1;$ the following relational expression of the measurement formulas can be further derived:

$Sy>Dy-Ty;$ $Sy<Dy-Ty+Wy2;$ $Sy<Ty;$ $Sy<Dy-Ty+Wy1.$

Figure 9:
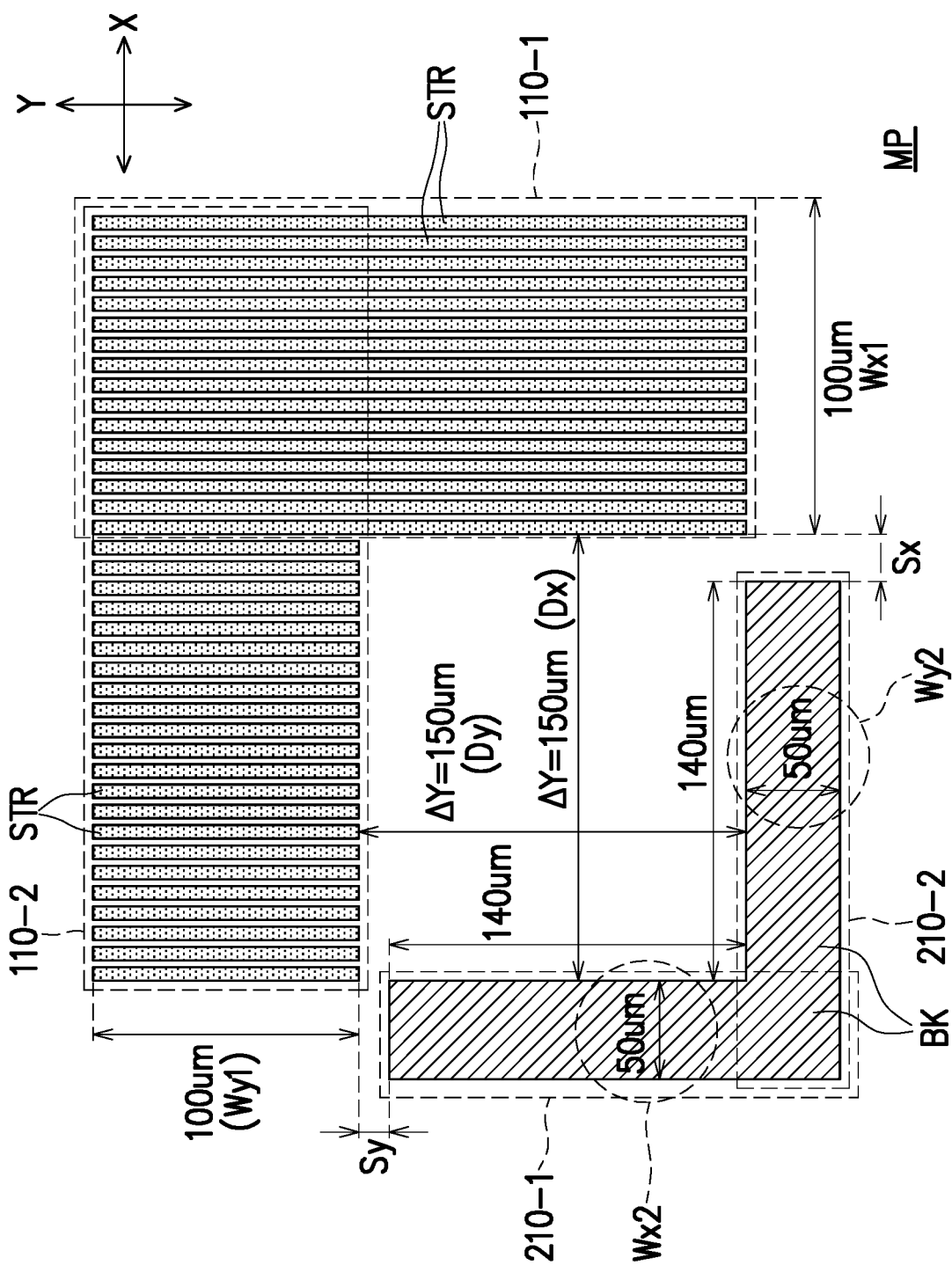
FIG. 9 is a schematic top view of a measurement pattern of bonded wafers according to some exemplary embodiments of the present disclosure.

FIG. 9 is a schematic top view of a measurement pattern of bonded wafers according to some exemplary embodiments of the present disclosure. In the exemplary embodiment, the target distance Dx between the first portion 110-1 and the first part 210-1 is set as 150 μm, while the width Wx1 of the first portion 110-1 is set as 100 μm and the width Wx2 of the first part 210-1 is set as 50 μm. Under such conditions, and by knowing the measurement formulas beforehand, the relationship between the search distance Tx and the actual shifting amount Sx should be as follows:

$$Tx+Sx<250 \text{ μm } (Dx+Wx1); \quad (1)$$

$$Tx<200 \text{ μm } (Dx+Wx2); \quad (2)$$

$$Tx>Sx \text{ (}Tx \text{ is larger than 125 μm and } Sx \text{ is smaller than 125 μm)}. \quad (3)$$

Therefore, when the search distance Tx is set to be ±126 μm, the maximum actual shifting amount Sx measurable is calculated to be ±124 μm (250 μm−126 μm). Similarly, the maximum actual shifting amount Sx measurable may be altered depending on the search distance Tx. For example, when the search distance Tx is set to be ±130 μm, then the maximum actual shifting amount Sx measurable is calculated to be ±120 µm (250 µm−130 µm), and when the search distance Tx is set to be ±160 µm, then the maximum measurable actual shifting amount Sx is calculated to be ±90 µm (250 µm−160 µm). Furthermore, by altering the target distance Dx and the widths Wx1, Wx2, the search distance Tx and actual shifting amount Sx may also be appropriately controlled. The same measurement formulas would also apply when performing measurements along a different axis.

Based on the above, it is noted that the design and dimensions of the top wafer pattern 110 and the bottom wafer pattern 210 may be appropriately adjusted. Furthermore, by adjusting the target distance Dx, the widths (Wx1, Wx2, Wy1 and Wy2) of the top wafer pattern 110 and the bottom wafer pattern 210 along the first axis and second axis, the search distance Tx and actual shifting amount Sx may be controlled to fulfill different measurement conditions and to meet different product requirements.

In the above-mentioned embodiments, a measurement pattern including a top wafer pattern and a bottom wafer pattern is used for monitoring the overlay shift of bonded wafers. An automatic optical inspection device can be used to monitor the bonded wafers, which will help to automatically report the actual shifting amount of the measurement pattern to the SPC (statistical process control) system. The method has high productivity, and can prevent the manual misjudgment of overlay shift based on visual inspection from the naked eye. Overall, a high throughput measurement method is achieved, which will replace conventional methods based on the visual inspection. The overlay shift of the bonded wafers may also be measured in large quantities, while the quality of the measurement is assured.

In accordance with some embodiments of the present disclosure, a measurement pattern for monitoring overlay shift of bonded wafers includes a top wafer pattern and a bottom wafer pattern. The top wafer pattern includes a first portion with a width Wx1 measured along a first axis. The bottom wafer pattern includes a first part with a width Wx2 measured along the first axis, wherein the first portion of the top wafer pattern and the first part of the bottom wafer pattern are separated by a target distance Dx, and wherein the measurement pattern satisfies the following measurement formulas:

$$Tx > Dx - Sx;$$

$$Tx < Dx - Sx + Wx2;$$

$$Tx > Sx;$$

$$Tx < Dx - Sx + Wx1;$$

wherein, Tx represents a searching distance for finding an end-point of the first portion of the top wafer pattern or an end-point of the first part of the bottom wafer pattern using an automatic optical inspection device; and Sx represents an actual shifting amount of the first portion of the top wafer pattern along the first axis relative to the target distance Dx.

In accordance with some other embodiments of the present disclosure, a method for measuring overlay shift of bonded wafers includes the followings step. A top wafer having a top wafer pattern is provided, the top wafer pattern comprises a first portion and a second portion, wherein the first portion and the second portion constitute an upside-down L-shaped pattern. A bottom wafer having a bottom wafer pattern is provided, the bottom wafer pattern comprises a first part and a second part, wherein the first part and the second part constitute an L-shaped pattern. The top wafer is bonded to the bottom wafer so that the first portion faces the first part, and the second portion faces the second part. A shift of the first portion of the top wafer pattern relative to the first part of the bottom wafer pattern is measured along a first axis by using an automatic optical inspection device, wherein the method includes the following steps: performing a first search based on a searching distance Tx to find a first end-point of the first part of the bottom wafer pattern by detecting a dark to light brightness change of the measured pattern; performing a second search based on the searching distance Tx to find a second end-point of the first portion of the top wafer pattern by detecting a dark to light brightness change of the measured pattern; and calculating the distance between the first end-point and the second end-point to determine the shift of the first portion of the top wafer relative to the first part of the bottom wafer along the first axis.

In accordance with yet another embodiment of the present disclosure, a method for measuring overlay shift of bonded wafers includes the followings step. A top wafer having a top wafer pattern is bonded onto a bottom wafer having a bottom wafer pattern, wherein the top wafer pattern comprises a first portion with a width Wx1 measured along a first axis, and the bottom wafer pattern comprises a first part with a width Wx2 measured along the first axis. A first measurement is performed by: setting a target distance Dx in an automatic optical inspection device, wherein the target distance Dx is a distance between the first portion of the top wafer pattern and the first part of the bottom wafer pattern when no shifting of the bonded wafers along the first axis exists; setting a searching distance Tx in the automatic optical inspection device; using the automatic optical inspection device to perform a first search based on the searching distance Tx to find a first end-point of the first part of the bottom wafer pattern; using the automatic optical inspection device to perform a second search based on the searching distance Tx to find a second end-point of the first portion of the top wafer pattern; calculating the distance between the first end-point and the second end-point to obtain an actual distance Dac between the first portion of the top wafer pattern and the first part of the bottom wafer pattern; and determining the difference between the actual distance Dac and the target distance Dx to obtain an actual shifting amount Sx of the first portion of the top wafer pattern relative to the target distance Dx.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A measurement pattern for monitoring overlay shift of bonded wafers, comprising:
   a top wafer pattern comprising a first portion with a width Wx1 measured along a first axis;
   a bottom wafer pattern comprising a first part with a width Wx2 measured along the first axis, wherein the first portion of the top wafer pattern and the first part of the bottom wafer pattern are separated by a target distance Dx, and wherein the measurement pattern satisfies the following measurement formulas:

$$Tx > Dx - Sx;$$

$$Tx < Dx - Sx + Wx2;$$

$$Tx > Sx;$$

$$Tx < Dx - Sx + Wx1;$$

wherein, Tx represents a searching distance for finding an end-point of the first portion of the top wafer pattern or an end-point of the first part of the bottom wafer pattern using an optical inspection device; and Sx represents an actual shifting amount of the first portion of the top wafer pattern along the first axis relative to the target distance Dx.

2. The measurement pattern according to claim 1, wherein one of the first portion of the top wafer pattern and the first part of the bottom wafer pattern comprises a plurality of stripe patterns, and another one of the first portion of the top wafer pattern and the first part of the bottom wafer pattern comprises a bulk pattern.

3. The measurement pattern according to claim 2, wherein the plurality of stripe patterns is a dielectric material pattern, and the bulk pattern is a metallic material pattern.

4. The measurement pattern according to claim 1, wherein both of the first portion of the top wafer pattern and the first part of the bottom wafer pattern comprise a plurality of stripe patterns.

5. The measurement pattern according to claim 1, wherein both of the first portion of the top wafer pattern and the first part of the bottom wafer pattern comprise bulk patterns.

6. The measurement pattern according to claim 1, wherein:
the top wafer pattern further comprises a second portion with a width Wy1 measured along a second axis;
the bottom wafer pattern further comprises a second part with a width Wy2 measured along the second axis, wherein the second portion of the top wafer pattern and the second part of the bottom wafer pattern are separated by a target distance Dy, and wherein the measurement pattern satisfies the following measurement formulas:

$$Ty > Dy - Sy;$$

$$Ty < Dy - Sy + Wy2;$$

$$Ty > Sy;$$

$$Ty < Dy - Sy + Wy1;$$

wherein, Ty represents a searching distance for finding an end-point of the second portion of the top wafer pattern or an end-point of the second part of the bottom wafer pattern using the optical inspection device; and Sy represents an actual shifting amount of the second portion of the top wafer pattern along the second axis relative to the target distance Dy.

7. The measurement pattern according to claim 6, wherein the first portion and the second portion of the top wafer pattern constitute an upside-down L-shaped pattern, and the first part and the second part of the bottom wafer pattern constitute an L-shaped pattern.

8. A method for measuring overlay shift of bonded wafers, comprising:
providing a top wafer having a top wafer pattern comprising a first portion and a second portion;
providing a bottom wafer having a bottom wafer pattern comprising a first part and a second part;
bonding the top wafer to the bottom wafer so that the first portion faces the first part, and the second portion faces the second part;
measuring a shift of the first portion of the top wafer pattern relative to the first part of the bottom wafer pattern along a first axis by using an optical inspection device, comprising:
performing a first search based on a searching distance Tx to find a first end-point of the first part of the bottom wafer pattern by detecting a dark to light brightness change of the measured pattern;
performing a second search based on the searching distance Tx to find a second end-point of the first portion of the top wafer pattern by detecting a dark to light brightness change of the measured pattern; and
calculating the distance between the first end-point and the second end-point to determine the shift of the first portion of the top wafer relative to the first part of the bottom wafer along the first axis.

9. The method according to claim 8, further comprising:
setting a first target end-point and a second target end-point in the optical inspection device prior to performing the first search and the second search, wherein the first target end-point and the second target end-point corresponds to the relative positions of the first part of the bottom wafer and the first portion of the top wafer when no shifting of the bonded wafers exists, and wherein
the first search is performed by using the first target end-point as a center point of search and performing a positive value to negative value search with the searching distance Tx; and
the second search is performed by using the second target end-point as a center point of search and performing a negative value to positive value search with the searching distance Tx.

10. The method according to claim 9, wherein,
the first search is performed by using the optical inspection device to scan along a first direction of the first axis to detect the dark to light brightness change, and
the second search is performed by using the optical inspection device to scan along a second direction of the first axis to detect the dark to light brightness change, wherein the second direction is opposite to the first direction.

11. The method according to claim 8, wherein the optical inspection device satisfies the following measurement formulas for measuring overlay shift of the bonded wafers:

$$Tx > Dx - Sx;$$

$$Tx < Dx - Sx + Wx2;$$

$$Tx > Sx;$$

$$Tx < Dx - Sx + Wx1;$$

wherein, Dx represents a target distance separating the first portion of the top wafer pattern and the first part of the bottom wafer pattern when no shifting of the bonded wafers along the first axis exists;

Sx represents an actual shifting amount of the first portion of the top wafer pattern along the first axis relative to the target distance Dx;

Wx1 represents a width of the first portion measured along the first axis; and

Wx2 represents a width of the first part measured along the first axis.

12. The method according to claim 8, wherein one of the first portion of the top wafer pattern or the first part of the bottom wafer pattern comprises a plurality of stripe patterns, and another one of the first portion of the top wafer pattern or the first part of the bottom wafer pattern comprises a bulk pattern.

13. The method according to claim 8, further comprising:
measuring a shift of the second portion of the top wafer relative to the second part of the bottom wafer along a second axis by using the optical inspection device, comprising:
  performing a third search based on a searching distance Ty to find a third end-point of the second part of the bottom wafer pattern by detecting a dark to light brightness change of the measured pattern;
  performing a fourth search based on the searching distance Ty to find a fourth end-point of the second portion of the top wafer pattern by detecting a dark to light brightness change of the measured pattern; and
  calculating the distance between the third end-point and the fourth end-point to determine the shift of the second portion of the top wafer relative to the second part of the bottom wafer along the second axis.

14. A method for measuring overlay shift of bonded wafers, comprising:
bonding a top wafer having a top wafer pattern onto a bottom wafer having a bottom wafer pattern, wherein the top wafer pattern comprises a first portion with a width Wx1 measured along a first axis, and the bottom wafer pattern comprises a first part with a width Wx2 measured along the first axis;
performing a first measurement by:
  setting a target distance Dx in an optical inspection device, wherein the target distance Dx is a distance between the first portion of the top wafer pattern and the first part of the bottom wafer pattern when no shifting of the bonded wafers along the first axis exists;
  setting a searching distance Tx in the optical inspection device;
  using the optical inspection device to perform a first search based on the searching distance Tx to find a first end-point of the first part of the bottom wafer pattern;
  using the optical inspection device to perform a second search based on the searching distance Tx to find a second end-point of the first portion of the top wafer pattern;
  calculating the distance between the first end-point and the second end-point to obtain an actual distance Dac between the first portion of the top wafer pattern and the first part of the bottom wafer pattern; and
  determining the difference between the actual distance Dac and the target distance Dx to obtain an actual shifting amount Sx of the first portion of the top wafer pattern relative to the target distance Dx.

15. The method according to claim 14, wherein the first end-point and the second end-point are found by detecting a dark to light brightness change of the measured pattern using the optical inspection device during the first search and the second search.

16. The method according to claim 14, wherein the optical inspection device satisfies the following measurement formulas for measuring overlay shift of the bonded wafers:

$$Tx > Dx - Sx;$$

$$Tx < Dx - Sx + Wx2;$$

$$Tx > Sx;$$

$$Tx < Dx - Sx + Wx1.$$

17. The method according to claim 14, wherein one of the first portion of the top wafer pattern and the first part of the bottom wafer pattern comprises a plurality of stripe patterns, and another one of the first portion of the top wafer pattern and the first part of the bottom wafer pattern comprises a bulk pattern.

18. The method according to claim 14, wherein both of the first portion of the top wafer pattern and the first part of the bottom wafer pattern comprise a plurality of stripe patterns.

19. The method according to claim 14, wherein both of the first portion of the top wafer pattern and the first part of the bottom wafer pattern comprise bulk patterns.

20. The method according to claim 14, wherein the top wafer pattern further comprises a second portion with a width Wy1 measured along a second axis, and the bottom wafer pattern further comprises a second part with a width Wy2 measured along the second axis, and the method further comprises:
performing a second measurement by:
  setting a target distance Dy in the optical inspection device, wherein the target distance Dy is a distance between the second portion of the top wafer pattern and the second part of the bottom wafer pattern when no shifting of the bonded wafers along the second axis exists;
  setting a searching distance Ty in the optical inspection device;
  using the optical inspection device to perform a third search based on the searching distance Ty to find a third end-point of the second part of the bottom wafer pattern;
  using the optical inspection device to perform a fourth search based on the searching distance Ty to find a fourth end-point of the second portion of the top wafer pattern;
  calculating the distance between the third end-point and the fourth end-point to obtain an actual distance Dac2 between the second portion of the top wafer pattern and the second part of the bottom wafer pattern; and
  determining the difference between the actual distance Dac2 and the target distance Dy to obtain an actual shifting amount Sy of the second portion of the top wafer pattern relative to the target distance Dy.

\* \* \* \* \*